(12) United States Patent
Kadono et al.

(10) Patent No.: US 7,248,190 B2
(45) Date of Patent: Jul. 24, 2007

(54) VARIABLE-LENGTH ENCODING METHOD, VARIABLE-LENGTH DECODING METHOD, STORAGE MEDIUM, VARIABLE-LENGTH ENCODING DEVICE, VARIABLE-LENGTH DECODING DEVICE, AND BIT STREAM

(75) Inventors: Shinya Kadono, Nishinomiya (JP); Yoshinori Matsui, Ikoma (JP); Satoshi Kondo, Yawata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/368,437

(22) Filed: Mar. 7, 2006

(65) Prior Publication Data

US 2006/0145897 A1 Jul. 6, 2006

Related U.S. Application Data

(62) Division of application No. 11/064,455, filed on Feb. 24, 2005, now Pat. No. 7,088,269, which is a division of application No. 10/476,647, filed as application No. PCT/JP03/03035 on Mar. 13, 2003, now Pat. No. 6,954,156.

(30) Foreign Application Priority Data

Mar. 27, 2002 (JP) .............................. 2002-088345

(51) Int. Cl.
    *H03M 7/40* (2006.01)
(52) U.S. Cl. .......................... 341/67; 341/106; 341/107
(58) Field of Classification Search ................ 341/107, 341/106, 65, 141, 50, 51

See application file for complete search history.

(56) References Cited

U.S. PATENT DOCUMENTS 5,287,468 A 2/1994 Furuhashi et al.

(Continued)

FOREIGN PATENT DOCUMENTS

JP 5-199422 8/1993

(Continued)

OTHER PUBLICATIONS

Joint Video Team (JVT) of ISO/IEC MPEG and ITU-T VCEG, *Joint Model No. 1 (JM-1)*, Document JVT-A003, File JVT-A003.doc, Generated Jan. 2002, Pattaya, Thailand Dec. 3-7, 2001.

(Continued)

*Primary Examiner*—Jean Bruner Jeanglaude
(74) *Attorney, Agent, or Firm*—Wenderoth, Lind & Ponack, L.L.P.

(57) ABSTRACT

The present invention correctly decodes data encoded with a variable-length encoding method that improves the compression ratio. The variable-length encoding method encodes a unit data composed of a plurality of sub-data while referencing a parameter table, and includes: an initialization step in which the parameter table is set to initial values; a parameter table information encoding step in which information related to the initialized parameter table is encoded; a parameter obtaining step in which encoding parameters to be used in the encoding of sub-data are obtained from the parameter table; a sub-data encoding step in which variable-length encoding of the sub-data is performed with reference to the obtained encoding parameters; and an encoded information placement step in which the encoded information is placed in a position in which the information can be obtained before the encoded unit data.

7 Claims, 21 Drawing Sheets

U.S. PATENT DOCUMENTS

| | | | |
|---|---|---|---|
| 5,532,694 A | | 7/1996 | Mayers et al. |
| 5,666,161 A | * | 9/1997 | Kohiyama et al. ..... 375/240.18 |
| 5,856,930 A | | 1/1999 | Hosono |
| 5,940,289 A | | 8/1999 | Iwata et al. |
| 5,995,148 A | | 11/1999 | Haskell et al. |
| 6,026,198 A | * | 2/2000 | Okada ....................... 382/247 |
| 6,252,992 B1 | | 6/2001 | Ishikawa |
| 6,493,385 B1 | | 12/2002 | Sekiguchi et al. |
| 2001/0012365 A1 | | 8/2001 | Gaedke et al. |

FOREIGN PATENT DOCUMENTS

| | | |
|---|---|---|
| JP | 6-225279 | 8/1994 |
| JP | 8-46521 | 2/1996 |
| WO | 99/22525 | 5/1999 |

OTHER PUBLICATIONS

Nick B. Body et al., "Efficient Representation and Decoding of Static Huffman Code Tables in a Very Low Bit Rate Environment". Image Processing, 1998. ICIP 98. Proceeding. 1998 International Conference on Chicago, IL, USA, IEEE Comput. Soc., U.S., vol. 3, Oct. 4, 1998, pp. 90-94.

Frank Hartung et al., "Improved Encoding of DCT Coefficients for Low Bit-rate Video Coding Using Multiple VLC Tables", Image Processing, 1999. ICIP 99. Proceedings. 1999 International Conference on Kobe, Japan. Oct. 24-28, 1999, Piscataway, NJ, USA, IEEE, U.S., Oct. 24, 1999, pp. 51-55.

N. Jesper Larsson et al., "Off-line Dictionary-based Compression". Proceedings of the IEEE. IEEE, New Yrok, U.S., vol. 88, No. 11, Nov. 2000.

* cited by examiner (a)

| data | bit string |
|---|---|
| | |
| 1 | 010 |
| 2 | 011 |
| 3 | 00100 |
| 4 | 00101 |
| 5 | 00110 |
| 6 | 00111 |
| 7 | 0001000 |
| 8 | 0001001 |
| 9 | 0001010 |
| 10 | 0001011 |

30a

| data | bit string |
|---|---|
| | |
| 2 | 010 |
| 3 | 011 |
| 4 | 00100 |
| 5 | 00101 |
| 6 | 00110 |
| 7 | 00111 |
| 8 | 0001000 |
| 9 | 0001001 |
| 10 | 0001010 |

30b

| data | bit string |
|---|---|
| | |
| 4 | 010 |
| 5 | 011 |
| 6 | 00100 |
| 7 | 00101 |
| 8 | 00110 |
| 9 | 00111 |
| 10 | 0001000 |

30c (a)

(b)

(a)

(b)

VARIABLE-LENGTH ENCODING METHOD, VARIABLE-LENGTH DECODING METHOD, STORAGE MEDIUM, VARIABLE-LENGTH ENCODING DEVICE, VARIABLE-LENGTH DECODING DEVICE, AND BIT STREAM

This is a divisional application of U.S. application Ser. No. 11/064,455, filed Feb. 24, 2005, is now a U.S. Pat. No. 7,088,269 which is a divisional application of U.S. application Ser. No. 10/476,647, filed on Nov. 4, 2003, now U.S. Pat. No. 6,954,156, which is a national stage application of International Application No. PCT/JP03/03035, filed Mar. 13, 2003.

TECHNICAL FIELD

The present invention relates to variable-length encoding methods, their corresponding variable-length decoding methods, storage media that store programs for executing such processes on a computer, variable-length encoding devices, and their corresponding variable-length decoding devices. In particular, the present invention relates to adaptive variable-length encoding methods that optimize encoding methods by means of encoded data, variable-length decoding methods that correspond to these methods, storage media that store programs for executing such processes on a computer, adaptive variable-length encoding devices that optimize encoding methods by means of encoded data, and variable-length decoding devices that correspond to these devices.

BACKGROUND ART

In recent years, formats such as JPEG for still images and MPEG for moving images have been standardized as techniques for compressing and decompressing pictures due to efforts toward creating international standards for image encoding schemes.

The MPEG (Moving Picture Experts Group) encoding scheme is primarily composed of a motion compensation inter-frame prediction unit, a DCT (discrete cosine transform) unit, and a variable-length encoding unit. The motion compensation inter-frame prediction unit detects motion vectors from inputted picture data and earlier picture data, and creates residual error data from the motion vectors and the earlier picture data. The DCT unit performs DCT transformations on the residual error data. A quantization unit quantizes DCT coefficients, and the variable-length encoding unit assigns code words to the quantized DCT coefficients and motion vectors.

The encoded image data in the MPEG encoding scheme has a hierarchical structure of six layers: sequence, GOP (Group Of Picture), picture, slice, macroblock, and block. A picture is the basic encoding unit that corresponds to a single picture, and is composed of a plurality of slices. A slice is a synchronization recovery unit, a band-shaped area composed of one or a plurality of macroblocks.

Variable-length encoding refers to one kind of entropy encoding. As there is variation in the probability of values such as post-DCT transformation coefficients (DCT coefficients) and motion vector values, variable-length encoding reduces the average amount of data by assigning short code words to those values that have a high probability, and assigning long code words to those values that have a low probability.

The main types of variable-length encoding include Huffman encoding and arithmetic encoding.

Huffman encoding is a method in which code words are determined by a Huffman code tree in which each symbol is a leaf. Huffman encoding uses a correspondence table (code table) that includes code words (bit strings) for each code.

To improve the compression ratio, Huffman encoding uses methods such as a method in which a code table is created that corresponds to statistical properties of the changing moving image, and a method in which a plurality of code tables are prepared and code tables are switched in response to statistical properties of the pictures. Information theory establishes that a code table in which $\log_2 (1/p)$ bits are assigned to the codes of a probability p has the smallest average volume of data. That is why, in the method of switching a plurality of code tables, the probability is calculated from encoded data, and a code table is selected so that bit numbers close to $\log_2 (1/p)$ bits are assigned to the codes of the probability p.

Arithmetic encoding is a technique in which the sequence of symbols is projected to intervals [0, 1] in response to the probability, and a probability space on a number line is expressed as an appropriate binary number within that interval. In arithmetic encoding, encoding is performed while constantly monitoring statistical properties. Specifically, probability tables are rewritten in response to the contents of the pictures, and code words are determined while referencing the probability tables. More specifically, in arithmetic encoding, the probability used in arithmetic operations is successively updated by encoded data so that $\log_2 (1/p)$ bits are assigned to a code of the probability p.

Unlike Huffman encoding, in arithmetic encoding, bit strings corresponding to code words can be obtained with only arithmetic operations (addition, subtraction, multiplication, and division), and therefore, the amount of memory required to store the code table can be reduced as compared to Huffman encoding. Furthermore, it is possible to respond to changes in statistical properties during encoding by rewriting the probability table. However, arithmetic operations, in particular multiplication and division operations, require great arithmetic capacity; thus one drawback is that it is difficult to effectuate arithmetic operations in devices with low arithmetic capacity.

In the above-described adaptive encoding methods, compression efficiency can be improved as compared to fixed encoding methods, because the encoding method continues to be dynamically optimized with encoded data.

However, the following problems occur when dynamically optimizing the encoding method with encoded data.

Learning-based dynamic encoding methods are performed, for example, on picture data after the header, that is, on each slice, macroblock, or block. In this case, arithmetic encoding uses a fixed probability table for the initial values for each sub-unit for encoding in each picture, and Huffman encoding uses a fixed variable-length code table as an initial code table in each picture. As fixed initial values are used in this way, the encoding compression efficiency cannot be considered favorable until optimal probability tables and code tables are obtained with learning after initialization. In particular, when the total amount of data is small, the proportion of data required for learning increases, and the compression ratio is not that high.

On the other hand, when a portion of the encoded data used in learning is lost in the transmission line, proper learning cannot be performed in the decoding device, and decoding becomes impossible. Further, in the case of image data, picture quality deterioration occurs due to transmission errors. Although regularly resetting the results of the learning protects against transmission errors, this protection is vulnerable to error when the reset interval is long and thus it is unavoidable that the reset interval will be short to a certain extent.

Unless the above-described problem of transmission error is solved, the compression efficiency of current adaptive encoding methods will not improve sufficiently.

SUMMARY OF THE INVENTION

An object of the present invention is to improve the compression efficiency variable-length encoding methods used in such areas as image compression.

Another object of the present invention is to correctly decode data that is encoded by a variable-length encoding method having improved compression efficiency.

In one aspect of the present invention, a variable-length encoding method encodes a unit data composed of a plurality of sub-data while referencing parameter tables. The method comprises the steps of:

setting a parameter table to initial values;
encoding information related to the initialized parameter table;
obtaining encoding parameters to be used in the encoding of the sub-data from the parameter table;
performing variable-length encoding of the sub-data with reference to the obtained encoding parameters; and
placing the encoded information related to the initialized parameter table in a position in which the information can be obtained before the encoded unit data.

It should be noted that encoding parameters refers to information that indicates the occurrence frequency of data, and are obtained from the parameter table and referenced during the encoding of the sub-data. In the case of arithmetic encoding, although the parameter table corresponds to a probability table, and encoding parameters correspond to probability here, the present invention is not limited to these.

With this encoding method, compression efficiency is improved when encoding the unit data because encoding parameters obtained from the parameter table are used in the encoding of the sub-data. Furthermore, because the information related to the initialized parameter table is encoded and placed in a position in which it can be obtained before the encoded unit data, the encoded unit data can be decoded correctly during decoding by using that parameter table as initial values.

In another aspect of the present invention, the variable-length encoding method updates the parameter table based on encoded sub-data values, and obtains the encoding parameters from the updated parameter table.

With this encoding method, compression efficiency is improved when encoding the unit data because the parameter table is updated based on encoded sub-data values.

In another aspect of the present invention, the variable-length encoding method obtains initial values of the encoding parameters to be used in the sub-data encoding step from the parameter table based on values of the immediately prior encoded sub-data.

With this encoding method, the encoding parameters can be derived in real time and encoding speed will increase because the initial values of the encoding parameters are obtained from the parameter table based on values of the immediately prior encoded sub-data.

In another aspect of the present invention, the variable-length encoding method obtains the initial values of the encoding parameters in the sub-data encoding step from the parameter table based on values of the encoded sub-data to be encoded.

With this encoding method, the initial values of the encoding parameters in the sub-data encoding step are obtained from the parameter table based on values of the encoded sub-data to be encoded, and there is high compression efficiency even when the contents of the sub-data and the immediately prior sub-data are greatly different.

In another aspect of the present invention, the variable-length encoding method performs arithmetic encoding of the sub-data in the sub-data encoding step with reference to the encoding parameters.

There is good compression efficiency with this encoding method because arithmetic encoding is used as a method of encoding the sub-data. It should be noted that the parameter table corresponds to a probability table, and the encoding parameters correspond to probability.

In another aspect of the present invention, the information related to the parameter table in the variable-length encoding method is the parameter itself.

In another aspect of the present invention, only a portion of the parameter table is encoded in the information encoding step of the variable-length encoding method.

With this encoding method, only a portion of the initialized parameter table is encoded, not the entire initialized parameter table, and therefore the amount of encoding can be decreased.

In another aspect of the present invention, a portion of the parameter table in the variable-length encoding method is a portion of the parameters that correspond to encoded data with a high probability.

With this encoding method, the amount of encoding can be decreased while ensuring that satisfactorily correct decoding is performed during decoding because only a portion of the initialized parameter table that corresponds to encoded data with a high probability is encoded.

In another aspect of the present invention, the encoded information related to the parameter table in the variable-length encoding method is information that indicates the parameter table.

With this encoding method, the amount of encoding can be decreased because the encoded information indicating the parameter table is encoded, and not the parameter table itself.

In another aspect of the present invention, the encoded information that indicates the encoded parameter table is placed as a portion of common data for the unit data in the encoded information placement step of the variable-length encoding method.

With this encoding method, information that indicates the parameter table is placed as a portion of common data in the unit data and functions as a portion therein, and therefore the amount of encoding can be decreased.

In another aspect of the present invention, the information related to the parameter table is encoded with a fixed encoding method in the information encoding step of the variable-length encoding method.

With this encoding method, the information related to the initialized parameter table is statically encoded because a fixed encoding method is used, and thus the information related to the initialized parameter table can be reliably decoded.

In another aspect of the present invention, the variable-length encoding method further includes an encoding determination step in which it is determined whether or not information related to the initialized parameter table is encoded, and a flag placement step in which a flag that identifies a result of the determination is placed in a position in which the flag can be obtained before the encoded unit data.

With this encoding method, a determination can be made whether or not the information related to the parameter table is encoded by using a flag that is placed in a position in which the flag can be obtained before the unit data. It should be noted that the information related to the parameter table used as initial values is not encoded when, for example, the amount of data until the next probability table is initialized is sufficiently large (in other words, the proportion of the amount of data required for learning to the total amount of data is sufficiently small, and the efficiency of learning is therefore good), or when the parameter table used as initial values is substantially consistent with the optimal parameter table obtained by learning.

In another aspect of the present invention, the unit of data in the variable-length encoding method is a picture in image data.

With this encoding method, the frequency with which the parameter tables are encoded is optimal for all image data, and therefore even if a portion of encoded data that should be used in learning is lost in a transmission error, and the same probability table as that of the time of encoding cannot be reproduced when decoding, images will not be unplayable for more than several seconds because the encoded probability table is decoded with high frequency. Furthermore, there will not be a large amount of redundant parameter table data.

In another aspect of the present invention, the unit of data in the variable-length encoding method is a slice in image data.

With this encoding method, the frequency with which the parameter tables are encoded is optimal for all image data, and therefore even if a portion of encoded data that should be used in learning is lost in a transmission error, and the same probability table as that of the time of encoding cannot be reproduced when decoding, the images will not be unplayable for more than several seconds as the encoded probability table with high frequency is decoded. Furthermore, there will not be a large amount of redundant parameter table data.

In another aspect of the present invention, the variable-length decoding method decodes a stream of unit data with reference to parameter tables, where the unit data is composed of a plurality of sub-data. The method includes the steps of:

decoding encoded information related to the parameter table of the stream;

setting initial values of the parameter table based on the decoded information related to the parameter table;

obtaining encoding parameters to be used in decoding sub-data from the parameter table; and performing variable-length decoding of the sub-data of the stream with reference to the obtained encoding parameters.

With this decoding method, because information related to the parameter table is decoded, and, based on that, the obtained parameter table is set as the initial values, the unit data can be correctly decoded.

In another aspect of the present invention, the variable-length decoding method updates the parameter table based on the decoded sub-data values, and obtains the encoding parameters from the updated parameter table.

In another aspect of the present invention, the variable-length decoding method performs arithmetic decoding of the sub-data with reference to the encoding parameters in the sub-data decoding step.

In another aspect of the present invention, the variable-length decoding method decodes the enclosed information related to the parameter table with a fixed decoding method in the enclosed information decoding step.

In another aspect of the present invention, a storage medium stores a program for executing variable-length encoding on a computer. The variable-length encoding is a variable-length encoding method that encodes a unit data composed of a plurality of sub-data while referencing parameter tables. The method includes the steps of:

setting a parameter table to initial values;

encoding information related to the initialized parameter table;

obtaining encoding parameters to be used in the encoding of sub-data from the parameter table;

performing variable-length encoding of the sub-data with reference to the obtained encoding parameters; and placing information related to the parameter table in a position in which the information can be obtained before the encoded unit data.

With this storage medium, variable-length encoding can be processed on a computer by loading the stored program onto a computer. Compression efficiency is increased when encoding unit data because encoded parameters obtained from the parameter table are used in encoding the sub-data in this process. Furthermore, because information related to the initialized parameter table is encoded, and placed in a position in which the information can be obtained before the encoded unit data, the encoded unit data can be correctly decoded when decoding with those parameters used as initial values.

In another aspect of the present invention, the storage medium stores a program for executing variable-length decoding on a computer. The variable-length decoding is a variable-length decoding method that decodes a stream of unit data with reference to parameter tables, where the unit data is composed of a plurality of sub-data. The method includes the steps of:

decoding encoded information related to the parameter table of the stream;

setting initial values of the parameter table based on the decoded information related to the parameter table;

obtaining encoding parameters to be used in decoding the sub-data from the parameter table; and performing variable-length decoding of the sub-data of the stream with reference to the obtained encoding parameters.

With this storage medium, variable-length decoding can be processed on a computer by loading the stored program onto a computer. In this process, the unit data can be correctly decoded because information related to the parameter table is decoded, and, based on that, the obtained parameter table is set as the initial values.

In another aspect of the present invention, a variable-length encoding method encodes a unit data composed of a plurality of sub-data while switching variable-length code tables, and includes the steps of:

setting a variable-length code table to initial values;

encoding information that indicates the initialized variable-length code tables;

selecting a variable-length code table to be used in encoding sub-data;

performing encoding of the sub-data with reference to the selected variable-length code table; and placing the encoded information that indicates the initialized variable-length code table in a position in which the information can be obtained before the encoded unit data.

With this encoding method, compression efficiency is improved when encoding the unit data because a selected variable length code table is used in encoding the sub-data. Furthermore, because information that indicates the initialized variable-length code table is encoded and placed in a position in which the information can be obtained before the unit data, the encoded unit data can be correctly decoded with the variable-length code table indicated by the information as the initial values in decoding.

In another aspect of the present invention, the variable-length encoding method selects the variable-length code table based on encoded sub-data values.

With this encoding method, compression efficiency is improved when encoding the unit data because the variable-length code table is selected based on encoded sub-data values.

In another aspect of the present invention, the variable-length code table to be used in encoding in the sub-data encoding step of the variable-length encoding method is the variable-length code table selected based on values of the immediately prior encoded sub-data.

With this encoding method, encoding can be performed in real time and the speed of the encoding will be increased because sub-data are encoded based on a variable-length code table that is selected based on values of the immediately prior encoded sub-data.

In another aspect of the present invention, the variable-length code table to be used in encoding in the sub-data encoding step of the variable-length encoding method is a variable-length code table selected based on values of the encoded sub-data to be encoded.

With this encoding method, there is high compression efficiency even when the contents of the sub-data and the immediately prior sub-data are greatly different because sub-data are encoded based on a variable-length code table that is selected based on values of the encoded sub-data to be encoded.

In another aspect of the present invention, the variable-length encoding method performs encoding with a fixed encoding method in the information encoding step.

With this encoding method, the information that indicates the initialized variable-length code table is reliably decoded because a fixed method of encoding is used.

In another aspect of the present invention, the variable-length encoding method further includes the steps of: determining whether or not information that indicates the initialized variable-length code table is encoded; and placing a flag that identifies a result of the determination in a position in which the flag can be obtained before the encoded unit data.

With this encoding method, whether or not the information that indicates the initialized variable-length code table has been encoded can be determined by a flag placed in a position in which the flag can be obtained before the encoded unit data. It should be noted that the information that indicates the variable-length code table used as initial values is not encoded in such cases when, for example, the amount of data until the next variable-length code table is initialized is sufficiently large (in other words, the proportion of the amount of data required for learning to the total amount of data is sufficiently small, and the efficiency of learning is therefore good), or when the variable-length code table used as initial values is substantially consistent with the optimal variable-length code table obtained by learning.

In another aspect of the present invention, the unit of data in the variable-length encoding method is a picture in image data.

With this encoding method, the frequency with which the information indicating the variable-length code tables is encoded is optimal for all image data, and therefore even if a portion of encoded information data is lost in a transmission error, the images will not be unplayable for more than several seconds. Furthermore, there will not be a large amount of redundant encoded information data.

In another aspect of the present invention, the unit of data of the variable-length encoding method is a slice in image data.

With this encoding method, the frequency with which the information indicating the variable-length code tables is encoded is optimal for all image data, and therefore even if a portion of encoded information data is lost in a transmission error, images will not be unplayable for more than several seconds. Furthermore, there will not be a large amount of redundant encoded information data.

In another aspect of the present invention, a plurality of syntax elements of the sub-data of the variable-length encoding method include a portion encoded by a variable-length encoding method in which variable-length code tables are switched, and a portion encoded by a fixed encoding method.

With this encoding method, for example with image data, high compression efficiency can be achieved by a variable-length encoding method in which the variable-length code tables are switched, and common data headers can be encoded easily with a fixed encoding method. It should be noted that as the compression efficiency for headers is always low, there is no particular impediment in using a fixed encoding method.

In another aspect of the present invention, a variable-length decoding method decodes a stream of unit data while switching variable-length code tables, where the unit data is composed of a plurality of sub-data. The method includes the steps of:

decoding encoded information that indicates a variable-length code table of the stream;

setting initial values of the variable-length code table based on the decoded information that indicates a variable-length code table;

selecting a variable-length code table to be used in decoding the sub-data; and performing variable-length decoding of the sub-data of the stream with reference to the selected variable-length code table.

With this decoding method, the encoded unit data can be correctly decoded because the encoded information related to the variable-length code table is decoded, and the variable-length code table indicated by the information is set as the initial values.

In another aspect of the present invention, a storage medium stores a program for executing variable-length encoding on a computer. The variable-length encoding is a variable-length encoding method that encodes a unit data composed of a plurality of sub-data while switching variable-length code tables. The method includes the steps of:

setting a variable-length code table to initial values;

encoding information that indicates the initialized variable-length code tables;

selecting a variable-length code table to be used in encoding sub-data;

performing encoding of the sub-data with reference to the selected variable-length code table; and placing the encoded information that indicates an encoded variable-length code table in a position in which the information can be obtained before the encoded unit data.

With this storage medium, compression efficiency is increased when encoding unit data because a selected variable-length code table is used in the processes of encoding the sub-data by the stored program on a computer. Furthermore, because information related to the initialized variable-length code table is encoded and placed in a position in which the information can be obtained before the encoded unit data, the encoded unit data can be correctly decoded when decoding with the variable-length code table that the information indicates as initial values.

In another aspect of the present invention, a storage medium stores a program for executing variable-length decoding on a computer. The variable-length decoding is a variable-length decoding method that decodes a stream of unit data while switching variable-length code tables, where the unit data is composed of a plurality of sub-data. The method includes the steps of:

decoding encoded information that indicates the variable-length code table of the stream;

setting initial values of the variable-length code tables based on the decoded information that indicates a variable-length code table;

selecting a variable-length code table to be used in decoding the sub-data; and performing variable-length decoding of the sub-data of the stream with reference to the selected variable-length code table.

With this storage medium, the encoded unit data can be correctly decoded because the information indicating the code table is decoded, and the variable-length code table indicated by the information is set as the initial values in the process of decoding by the program stored on a computer.

In another aspect of the present invention, a variable-length encoding device encodes a unit data composed of a plurality of sub-data while referencing parameter tables, and includes an initialization means, a parameter table information encoding means, a parameter obtainment means, a sub-data encoding means, and an encoded information placement means. The initialization means sets a parameter table to initial values. The parameter table information encoding means encodes information related to the initialized parameter table. The parameter obtainment means obtains encoding parameters to be used in the encoding of sub-data from the parameter table. The sub-data encoding means performs variable-length encoding of the sub-data with reference to the obtained encoding parameters. The encoded information placement means places information related to the parameter table in a position in which the information can be obtained before the encoded unit data.

With this encoding device, the compression efficiency is improved when encoding the unit data because encoded parameters obtained from the parameter table are used when the sub-data encoding means encodes sub-data. Furthermore, because the information related to the initialized parameter table is encoded by the parameter table information encoding means, and placed in a position by the encoded information placement means in which the information can be obtained before the encoded unit data, the parameter table can be obtained during decoding based on that information, and the encoded unit data can be correctly decoded with that parameter table as initial values.

In another aspect of the present invention, a variable-length decoding device decodes a stream of unit data with reference to parameter tables, where the unit data is composed of a plurality of sub-data. The device includes a parameter table information decoding means, a parameter table initialization means, a parameter obtainment means, and a sub-data decoding means. The parameter table information decoding means decodes encoded information related to a parameter table of the stream. The parameter table initialization means sets initial values of the parameter table based on the decoded information related to the parameter table. The parameter obtainment means obtains encoding parameters to be used in decoding sub-data from the parameter table. The sub-data decoding means perform variable-length decoding of the sub-data of the stream with reference to the obtained encoding parameters.

With this decoding device, the unit data can be correctly decoded because the encoded information related to the parameter tables is decoded, and the parameter table that is obtained based on that information is set as the initial values.

In another aspect of the present invention, a variable-length encoding device encodes a unit data composed of a plurality of sub-data while switching variable-length code tables. The device includes an initialization means, an information encoding means, a variable-length code table selection means, a sub-data encoding means, and an encoded information placement means. The initialization means sets a variable-length code table to initial values. The information encoding means encodes information indicating the initialized variable-length code table. The variable-length code table selection means selects a variable-length code table to be used in encoding the sub-data. The sub-data encoding means perform encoding of the sub-data with reference to the selected variable-length code table. The encoded information placement means places the encoded information indicating the encoded variable-length code table in a position in which the information can be obtained before the encoded unit data.

With this encoding device, the compression efficiency is improved when encoding unit data because a selected variable-length code table is used when the sub-data encoding means encodes sub-data. Furthermore, because the information that indicates the variable-length code tables is encoded by the parameter table information encoding means, and placed in a position by the encoded information placement means in which the information can be obtained before the encoded unit data, the variable-length code table indicated by that information can be obtained during decoding, and the encoded unit data can be correctly decoded with that variable-length code table as initial values.

In another aspect of the present invention, a variable-length decoding device decodes a stream of encoded unit data while switching variable-length code tables, where the unit data is composed of a plurality of sub-data. The device includes a variable-length code table information decoding means, a variable-length code table initialization means, a variable-length code table selection means, and a sub-data decoding means. The variable-length code table information decoding means decodes encoded information that indicates a variable-length code table of the stream. The variable-length code table initialization means sets initial values of a variable-length code table based on the decoded information indicating the variable-length code table. The variable-length code table selection means selects a variable-length code table to be used in decoding sub-data. The sub-data decoding means performs variable-length decoding of the sub-data of the stream with reference to the selected variable-length code table.

With this decoding device, the unit data can be correctly decoded because the encoded information related to variable-length code tables is decoded, and the variable-length code table is selected based on that information.

In another aspect of the present invention, a bit stream is generated by a variable-length encoding method for encoding the unit data while referencing parameter tables. The variable-length encoding method that generates the bit stream is any of the variable-length encoding methods described above as aspects of the present invention.

The effects of these variable-length encoding methods can be obtained with a bit stream, such as improved compression efficiency when encoding unit data.

BRIEF DESCRIPTION OF THE DRAWINGS

FIG. 13 shows the structures of a plurality of variable-length code tables;

DETAILED DESCRIPTION OF THE INVENTION

1. First Embodiment (1) Configuration of Variable-Length Encoding Device

[1] Variable-Length Encoding Device According to the Present Invention

Figure 1:
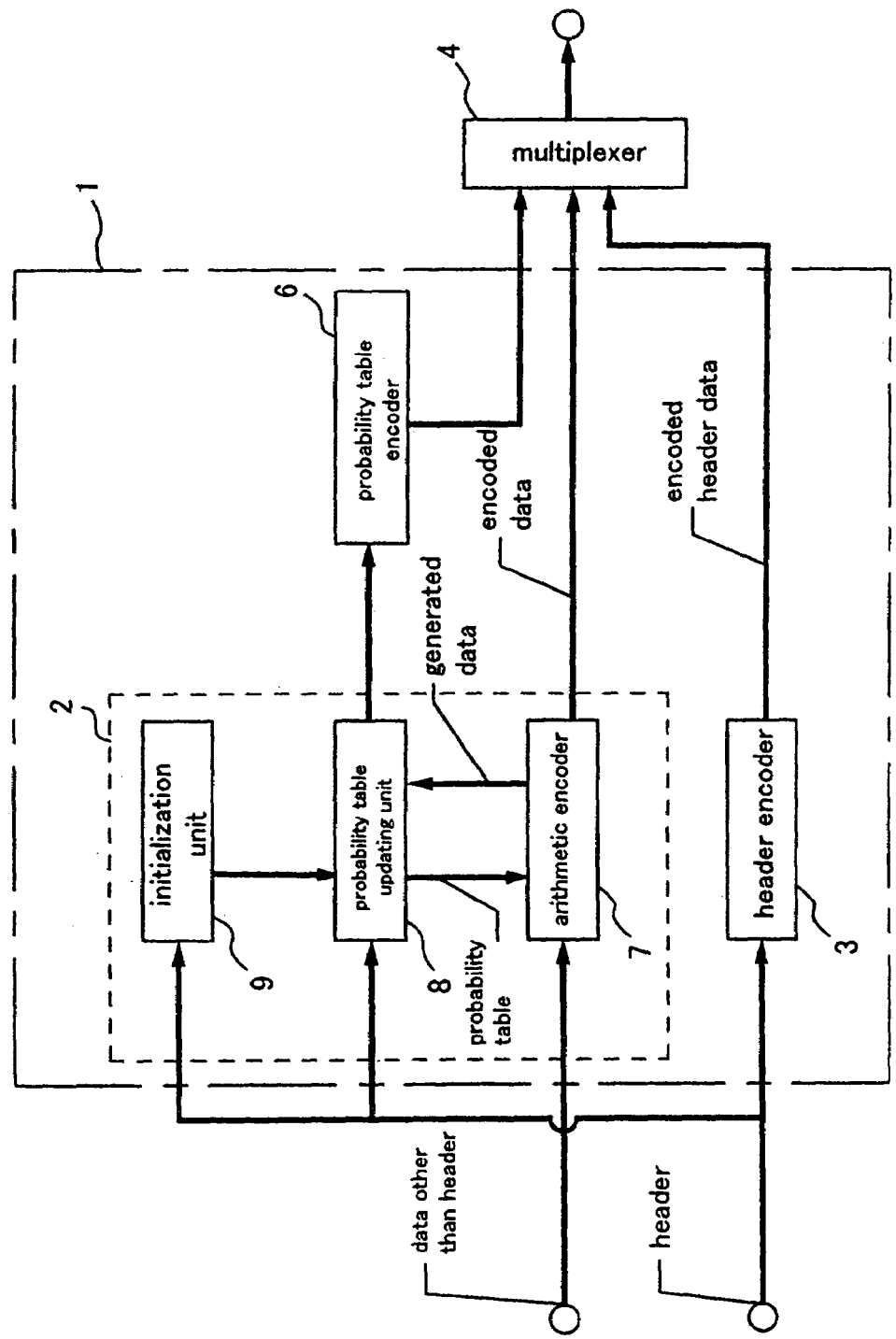
FIG. 1 is a block diagram showing the overall configuration of a variable-length encoding device according to a first embodiment of the present invention.

FIG. 1 is a block diagram of the overall configuration of a variable-length encoding device 1 according to one embodiment of the present invention. The variable-length encoding device 1 is a device for performing variable-length encoding on inputted data, and creating bit streams. In particular, the variable-length encoding device 1 is characterized in that it employs arithmetic encoding as a primary coding method. It should be noted that arithmetic encoding refers to an encoding method that increases encoding efficiency by dynamically updating a probability table in response to the probability of actually produced symbols.

Various types of input data are possible for the variable-length encoding device 1, but this embodiment will be described as one in which image data are input. In other words, the variable-length encoding device 1 has a function that performs entropy encoding on image signals that have been converted into data. With the MPEG scheme in particular, the image data that are input to the variable-length encoding device 1 are image data such as quantized DCT coefficients and motion vectors.

The variable-length encoding device 1 includes a data encoding unit 2 and a header encoder 3.

The data encoding unit 2 is a device for performing arithmetic encoding on data other than headers for each unit data, and is provided with an arithmetic encoder 7, a probability table updating unit 8, and an initialization unit 9. It should be noted that in the case of image data, the unit data referred to here is defined as a picture or a slice. Furthermore, each unit data is composed of a plurality of sets of sub-data. When the unit of data is a picture, sub-data are slices, macroblocks, or blocks, and when the unit of data is a slice, sub-data are macroblocks or blocks.

The arithmetic encoder 7 is a device for outputting generated data to the probability table updating unit 8 after data is input, and for encoding data based on the probability tables, i.e., the code words, that are output from the probability table updating unit 8.

The probability table updating unit 8 has a function that updates the probability tables, and is a device for outputting the probability tables, i.e., the code words, to the arithmetic encoder 7 while updating the probability tables in response to the probability of generated data that is output from the arithmetic encoder 7.

The initialization unit 9 is a device for outputting probability table initialization instructions to the probability table updating unit 8.

The header encoder 3 is a device for encoding header data with a fixed encoding method. A fixed encoding method refers to a method in which the code word for each code does not change during encoding, and includes fixed-length encoding methods and fixed variable-length encoding methods. Because a fixed encoding method is used, header data can be easily encoded.

On the other hand, an encoding method in which the code words that correspond to each code change is referred to as an adaptive encoding method. Furthermore, within adaptive encoding methods, there are static encoding methods in which the tables that indicate the relationship between codes and the code words that correspond to the codes are simply switched, and dynamic encoding, in which the code words themselves are successively updated. In other words, this means that a static encoding method is not a dynamic encoding method (an encoding method such as arithmetic encoding in which the corresponding relationship between codes and the code words that correspond to those codes is dynamically varied). Consequently, the compression ratio can be improved more with a dynamic encoding method than with a static encoding method.

The variable-length encoding device 1 is further provided with a probability table encoder 6. The probability table encoder 6 is a device for encoding the probability tables that are output from the probability table updating unit 8 with a fixed encoding method. Since the probability table encoder 6 uses a fixed encoding method, probability tables can be easily encoded.

A multiplexer 4 is a device for multiplexing the encoded header data that is output from the header encoder 3, the encoded data other than headers that is output from the arithmetic encoder 7, and the encoded probability table data that is output from the probability table encoder 6, and also for generating code strings (bit streams) and outputting these to a transmission line.

[2] Standard Image Encoding Device

Figure 2:
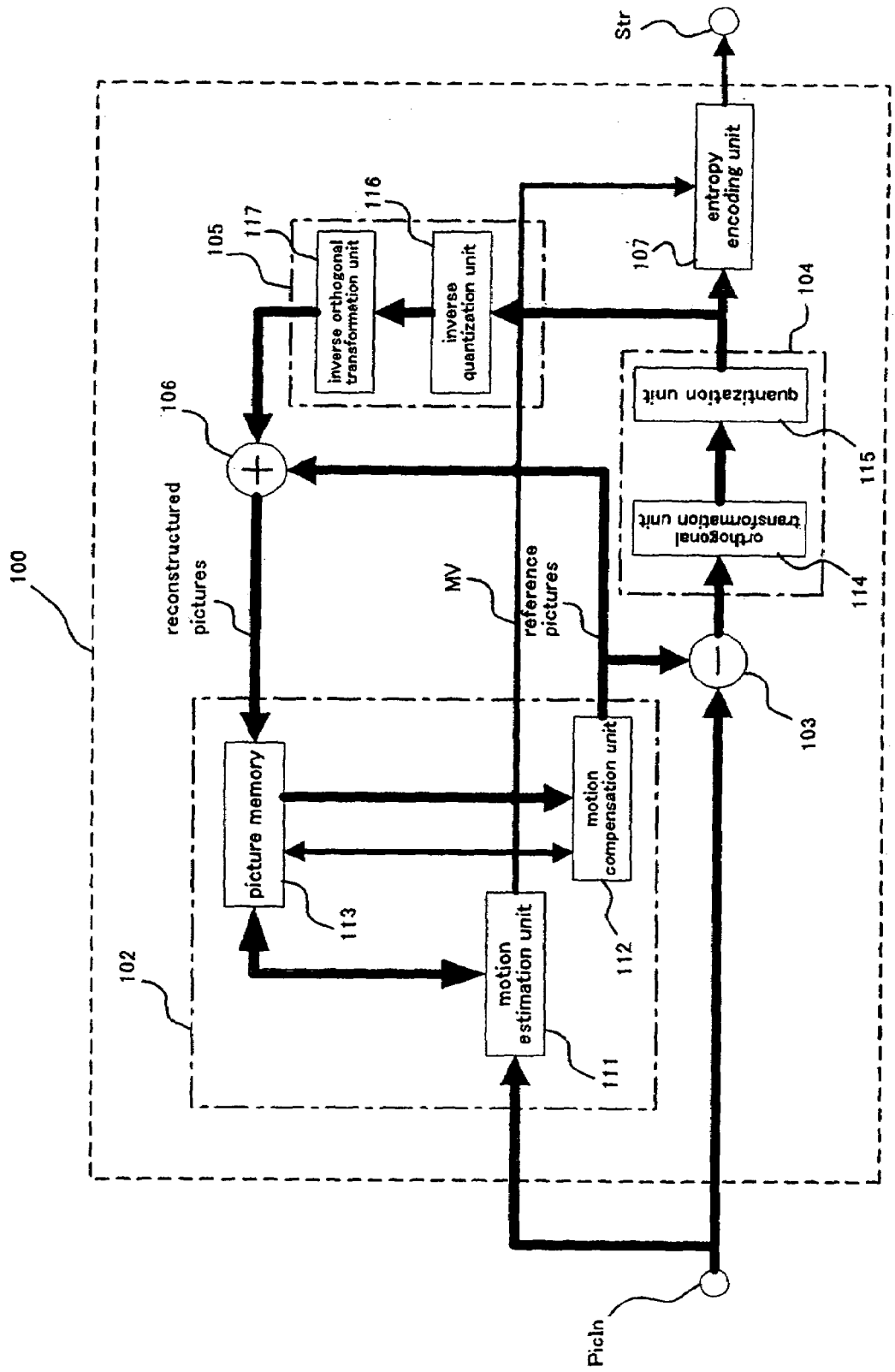
FIG. 2 is a block diagram showing the overall configuration of a standard image encoding device.

Here, the block diagram of FIG. 2 will be used to illustrate a configuration of a standard image encoding device 100. The standard image encoding device 100 includes a motion estimation/compensation unit (ME/MC) 102, a subtracter 103, a conversion encoding unit 104, a conversion decoding unit 105, an adder 106, and an entropy encoding unit 107. It should be noted that the data encoding unit 2 that was mentioned earlier corresponds to the entropy encoding unit 107.

The motion estimation/compensation unit 102 receives input picture data PicIn, and generates predicted block data for blocks that are to be encoded in the picture to be encoded. The motion estimation/compensation unit 102 includes a motion estimation unit (ME) 111, a motion compensation unit (MC) 112, and a picture memory 113.

The motion estimation unit 111 receives the input pictures PicIn, and calculates motion vectors MV, which are motions of the input pictures PicIn for reconstructured images in the picture memory 113. The motion estimation unit 111 outputs the motion vectors MV to the motion compensation unit 112, the picture memory 113, and the entropy encoding unit 107. Based on the motion vectors MV from the motion estimation unit 111, the motion compensation unit 112 generates (compensates for motion) picture data as reference pictures that correspond to the motions from the reconstructured pictures stored in the picture memory 113, and outputs this to the subtracter 103 and the adder 106. The picture memory 113 stores the reconstrucured pictures, and the reconstrucured pictures are read out with the motion estimation unit 111 and the motion compensation unit 112. It should be noted that when intra-picture encoding, the pixel value of the motion compensated reference picture is taken as 0, and the subtracter 103 and the adder 106 output the input data as is without subtracting or adding.

The subtracter 103 determines differential values between target data of the input picture PicIn and a reference picture from the motion compensation unit 112, and outputs differential data corresponding to those differential values to the conversion encoding unit 104.

The conversion encoding unit 104 executes data compression processing on the differential data from the subtracter 103, and outputs compressed data. The conversion encoding unit 104 includes an orthogonal transformation unit 114 and a quantization unit 115. The orthogonal transformation unit 114 carries out discrete cosine transform processing (DCT processing) on the differential data from the subtracter 103, and outputs that data to the quantization unit 115. DCT processing is one type of orthogonal transformation processing in which data of the spatial domain is converted to data of the frequency domain. The quantization unit 115 quantizes the DCT data from the orthogonal transformation unit 114 with a quantization step, and outputs quantization coefficients to the conversion decoding unit 105 and the entropy encoding unit 107.

The conversion decoding unit 105 carries out data expansion processing on the output from the conversion encoding unit 104, and outputs expanded data. The conversion decoding unit 105 includes an inverse quantization unit 116, and an inverse orthogonal transformation unit 117. The inverse quantization unit 116 inversely quantizes the output from the conversion encoding unit 104 with the above-described quantization step, and outputs that to the inverse orthogonal transformation unit 117. The inverse orthogonal transformation unit 117 carries out inverse discrete cosine transformation processing (IDCT processing) on the output from the inverse quantization unit 116, and outputs expanded data as predictive residual signals to the adder 106. IDCT processing is a process in which data of the frequency domain is transformed into data of the spatial domain.

When the macroblocks have undergone inter-frame motion compensation prediction encoding, the adder 106 outputs picture data obtained by adding the predictive residual signals from the conversion decoding unit 105 and the reference pictures from the motion compensation unit 112 to the picture memory 113 as reconstructured pictures.

The entropy encoding unit 107 carries out entropy encoding on the quantized post-DCT data from the DCT encoding unit 104. Entropy encoding refers to encoding in which a bit string of "0"s and "1"s is converted into a shorter bit string, using statistical properties of the bit string.

(2) Operation of Variable-Length Encoding Device

[1] Operation of Data Encoding Unit and Probability Table Encoder

Figure 3:
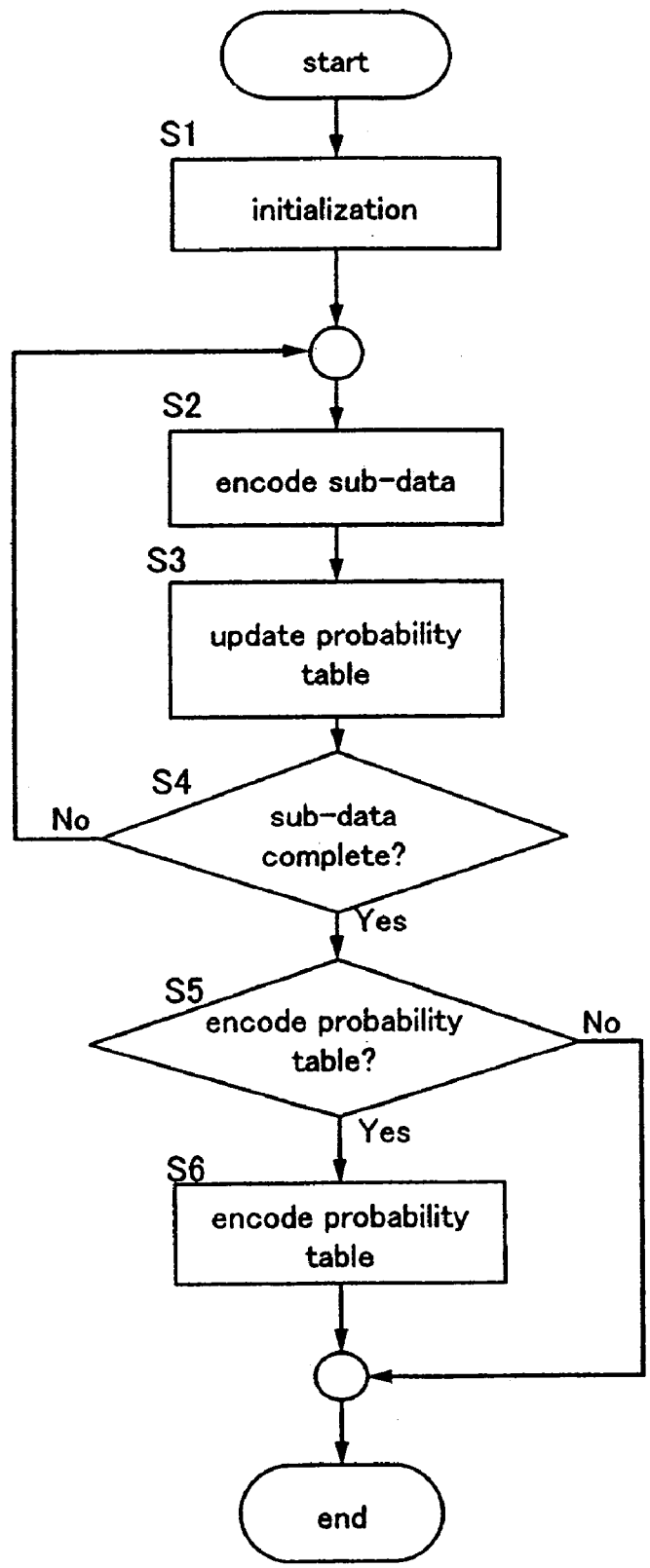
FIG. 3 is a flowchart showing an outline of the operation of a data encoding unit.

FIG. 3 is a flowchart showing an outline of the operation of the data encoding unit 2 and the probability table encoder 6.

In step S1, the initialization unit 9 outputs an initialization instruction to the probability table updating unit 8, and the probability table updating unit 8 sets a probability table for each unit data to initial values. In this initializing operation, the initialization unit 9 and the probability table updating unit 8 perform probability table initialization based on initialization data in the header. Data that is common to all unit data can be used as initialization data in the probability tables. When the unit of data is a picture, examples of effective common data for initialization include image encoding types (distinguishing between intra-coded pictures, predictive coded pictures, and bi-predictive coded pictures), and initial values of picture quantization parameters. It should be noted that common data without much relation to initialization includes parameters such as the order of image encoding, the order of picture display, motion vectors and image size. When the unit of data is a slice, examples include slice encoding types (distinguishing between intra-coded slices, predictive coded slices, and bi-predictive slices), and initial values of slice quantization parameters.

In step S2, the arithmetic encoder 7 and the probability table updating unit 8 cooperate to perform arithmetic encoding on sub-data. More specifically, based on the probability table output from the probability table updating unit 8, the arithmetic encoder 7 obtains probabilities used in the encoding of sub-data from the probability table, and references those probabilities to encode the sub-data. Specifically, the unit of data are pictures or slices, and macroblocks or blocks that are the sub-data are encoded.

In step S3, the probability table of generated data is updated by the probability table updating unit 8 in accordance with the generated data. In this embodiment, the updated probability table is used when arithmetic encoding is performed on the next sub-data.

In step S4, it is determined whether or not the encoding of all the sub-data is complete. If it is determined that the encoding of all the sub-data is not complete, the procedure returns to step S2 and the above-described operation is repeated.

In step S5, it is determined whether or not to encode the probability table, and if it is to be encoded, the procedure proceeds to step S6, and if it is not to be encoded, step S6 is skipped. The arithmetic encoder 7 generates an initial value flag that serves to identify the result of the determination, and outputs that along with the encoded data to the multiplexer 4. It should be noted that the probability table used as initial values is not encoded in such cases when, for example, the amount of data until the next probability table is initialized is sufficiently large (in other words, the proportion of the amount of data required for learning to the total amount of data that is occupied is sufficiently small, and the efficiency of learning is therefore good), or when the probability table used as initial values is substantially or completely consistent with the optimal probability table obtained by learning.

In step S6, the probability table of the probability table updating unit 8 is encoded by the probability table encoder 6.

Compression efficiency is improved by the above-described encoding method because, except for the first encoding of sub-data, the probability table is updated based on the encoded sub-data values, and probabilities are obtained from the probability table. In particular, because the probability table to be used in encoding sub-data is a probability table which is updated by arithmetic encoding of the previous sub-data, encoding can be achieved in real time and the encoding speed will be increased. Moreover, favorable compression efficiency can be obtained due to the spatial and temporal correlation of the pictures.

It should be noted that arithmetic encoding may be performed using a probability table obtained by performing arithmetic encoding of the initial values of the unit data. In this case, there is high compression efficiency even when there is a large difference between the contents of the unit data and the previous unit data.

Figure 4:
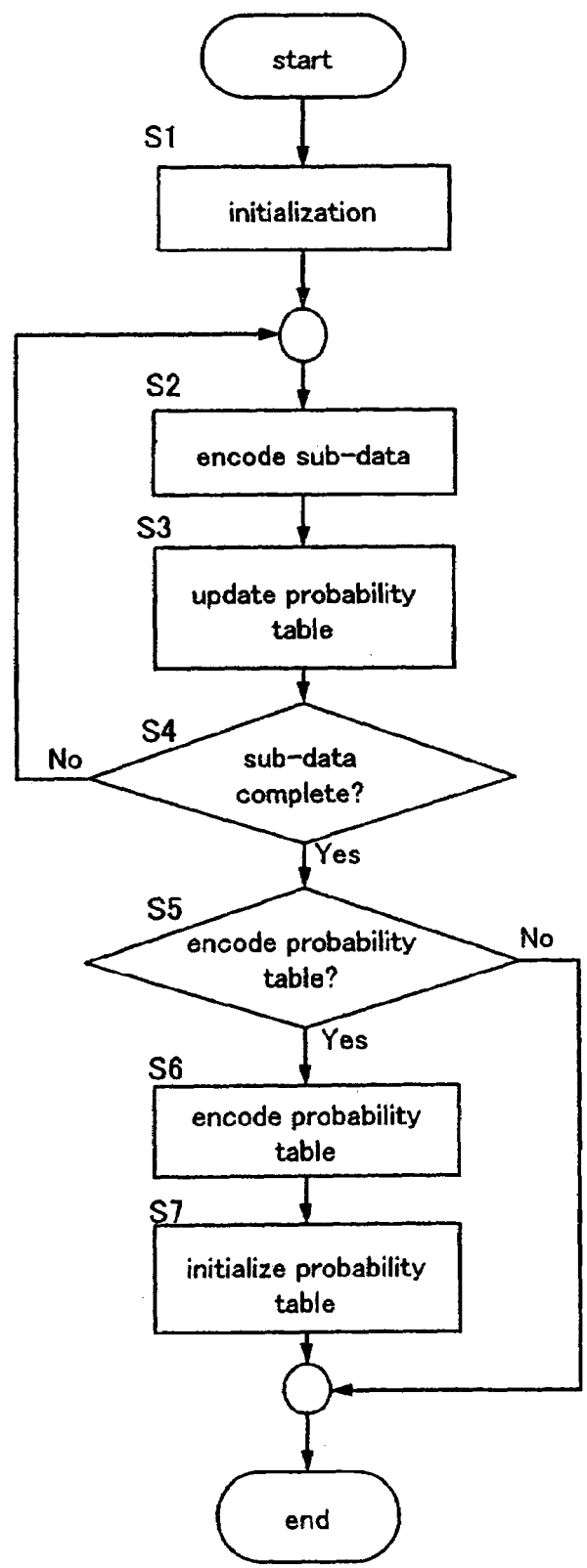
FIG. 4 is a flowchart showing an outline of the operation of a modified version of the data encoding unit.

The flowchart shown in FIG. 4 is a modification of the flowchart shown in FIG. 3, and pertains to a situation in which only a portion of the probability table is encoded when the code table of the probability table updating unit 8 is encoded by the probability table encoder 6 in step S6. In this situation, the amount of codes can be reduced, and furthermore, by employing a method in which only the portions of encoded data with high probability in the obtained probability table are encoded, sufficiently correct decoding can be achieved when decoding. Portions of data with low probability are initialized with initial values. In step S7, portions that were not encoded in the probability table are initialized with initial values. That is, when only the important portions of the probability table are encoded, by initializing with initial values the portions that are not encoded, all the ratios of the probability table can be set to specific values when the probability table is specified for encoding without relying on values of the probability table up until then, and the probability tables of the encoding device and the decoding device can be matched.

[2] Operation of Header Encoding Unit

The header encoder 3 encodes the inputted header data, and outputs the encoded header data to the multiplexer 4.

[3] Operation of Multiplexer

The multiplexer 4 generates a bit stream from the data that is output from the arithmetic encoder 7, the header encoder 3, and the probability table encoder 6, and outputs this to a transmission line.

Figure 5:
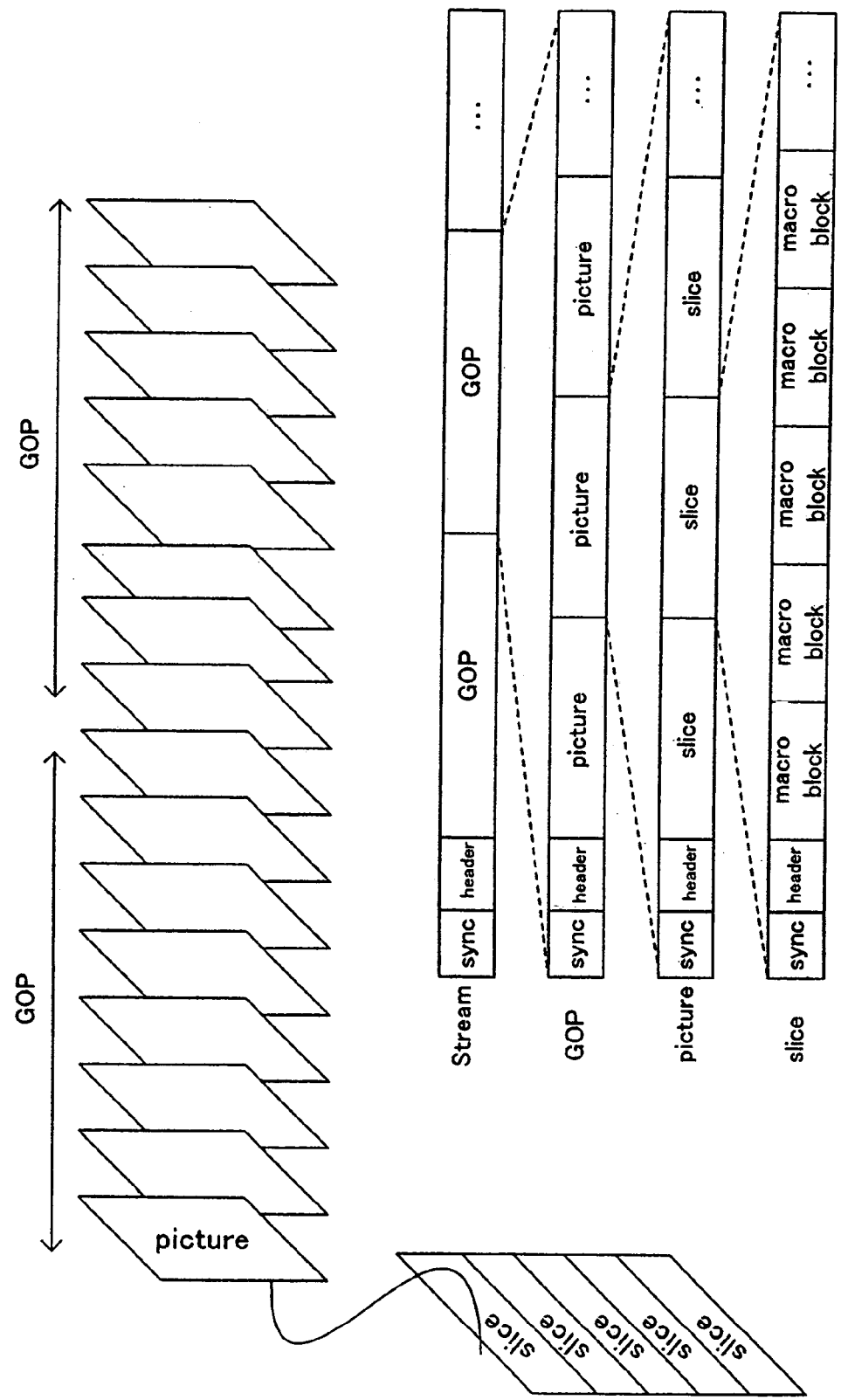
FIG. 5 shows an example of the structure of an image data stream.

FIG. 5 shows an example of the structure of a picture data stream. As shown in FIG. 5, the stream is composed of common data areas such as a header, and GOP (Group of Picture) areas. The GOP areas are composed of common data areas such as a header and the like, and a plurality of picture areas. The picture areas are composed of common data areas such as a header and the like, and a plurality of slice data areas. The slice data areas are composed of common data areas such as a header and the like, and a plurality of macroblock data areas.

Furthermore, the stream does not have to be a continuous bit stream. When transmitting in packets (which are finely divided data units), then header portions and data portions may be separated and transmitted separately. In this case, the header portions and data portions are not a single bit stream such as that shown in FIG. 5. However, in the case of packets, even though the sequence of transmission for the header portion and data portion is not continuous, the corresponding data portions and their corresponding header portions are simply transmitted in separate packets, and even though this is not a single bit stream, the concept is the same as for the bit stream illustrated in FIG. 5.

Figure 6:
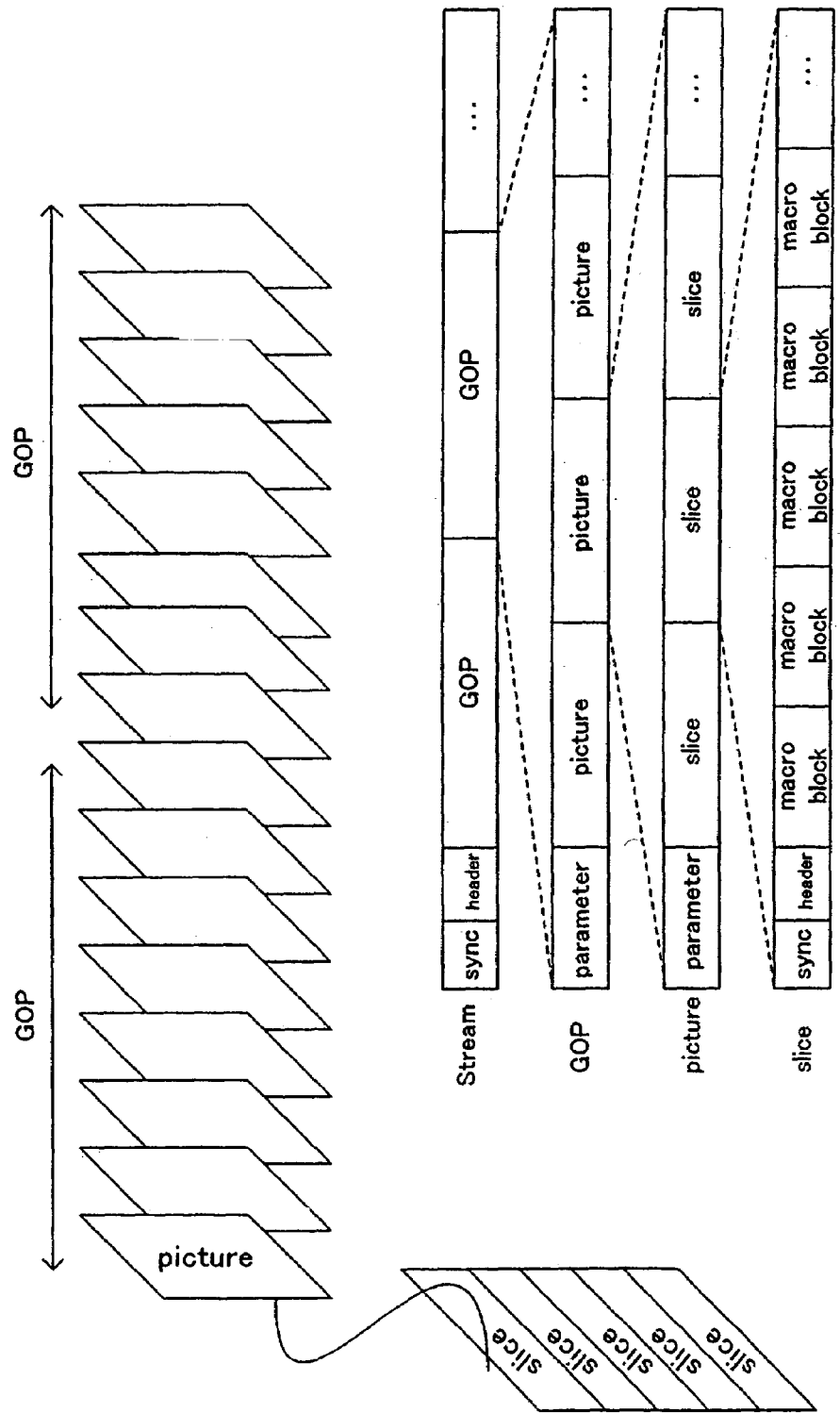
FIG. 6 shows another example of the structure of an image data stream.

FIG. 6 shows another example of the structure of a picture data stream. The structure of this stream is basically the same structure as the structure of the stream shown in FIG. 5, and therefore only the points of difference will be described below. In the structure of this stream, the GOPs and pictures do not have headers. Only the slices have headers. The GOPs and pictures have various parameters as common data in their leading portions. The parameters correspond to a header, but the difference is that parameters are also effective for subsequent pictures as long as the parameters are not updated. For example, this means that the parameters corresponding to a picture header are the picture header for all the pictures until parameters corresponding to the next picture header are transmitted.

Figure 7:
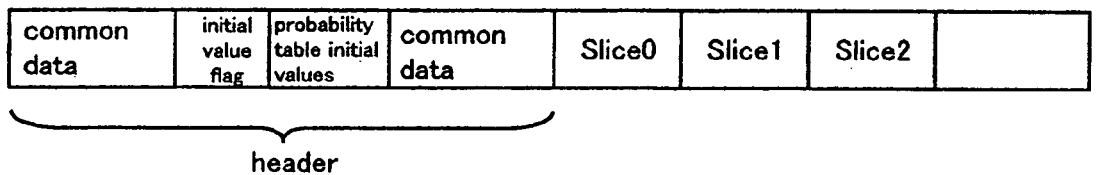
FIG. 7 shows bit stream data structures generated by a variable-length encoding device.
Figure 7:
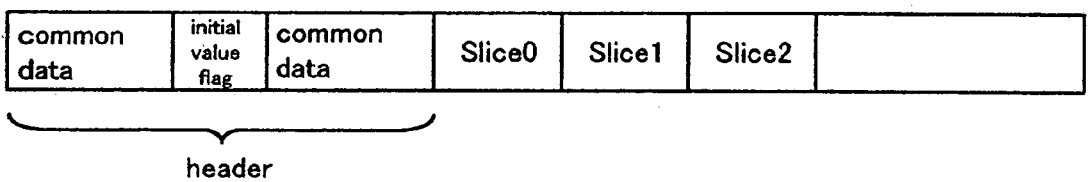

FIG. 7 shows the data structure of a bit stream that is output from the multiplexer 4 when the above-described unit data is the picture data of a picture. A picture is generally composed of a header, and a plurality of slices as encoded sub-data. The header indicates the beginning of encoded data for one picture and is primarily composed of the common data for each slice (for example, the image encoding type [distinguishing between intra-coded pictures and predictive coded pictures], and parameters such as numbers that indicate the order of picture encoding or the order of display).

An initial value flag is placed in the header. The initial value flag is a flag for identifying whether or not the probability table used for the initial values is encoded. If the probability table is encoded, the flag is "1," and if not encoded, the flag is "0."

Furthermore, as shown in FIG. 7(a), encoded probability table data is placed within the header as probability table initial values. When the probability table is not encoded, probability table encoded data is not output from the probability table encoder 6 to the multiplexer 4, the result of which, as shown in FIG. 7(b), is that probability table encoded data is not placed in the bit stream.

As described above, the header includes common data portions (which are originally in the header portion) that are encoded by the header encoder 3, an initial value flag generated by the arithmetic encoder 7, and encoded probability table data encoded by the probability table encoder 6. More particularly, the common data portions are divided into a leading portion side and a picture data side, and inserted therebetween are the initial value flag and the encoded probability table data, in that order.

Figure 8:
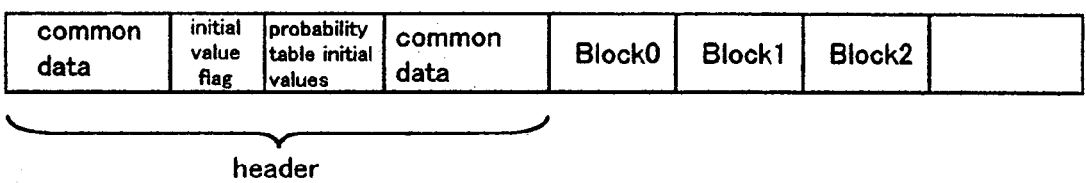
FIG. 8 shows bit stream data structures generated by a variable-length encoding device.
Figure 8:
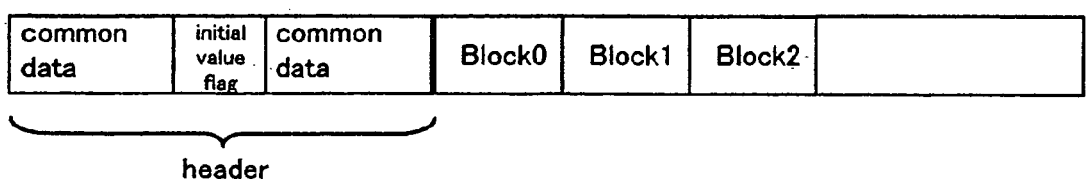

FIG. 8 shows the data structure of a bit stream that is output from the multiplexer 4 when the unit of data is a slice of image data. A slice is generally composed of a header, and a plurality of blocks (or macroblocks) as encoded sub-data. The header indicates the beginning of the encoded data of one slice and is primarily composed of the common data for each slice (parameters such as a starting code and a quantization scale). Furthermore, an initial value flag is placed in the header. The initial value flag is a flag for identifying whether or not the probability table used as the initial values is encoded. If the probability table is encoded, the flag is "1," and if not encoded, the flag is "0."

Moreover, as shown in FIG. 8(a), encoded probability table data is placed within the header as probability table initial values. When the probability table is not encoded, encoded probability table data is not output from the probability table encoder 6 to the multiplexer 4, the result of which, as shown in FIG. 8(b), is that encoded probability table data is not placed in the bit stream.

As described above, the header includes common data portions (which are originally in the header portion) that are encoded by the header encoder 3, an initial value flag generated by the arithmetic encoder 7, and encoded probability table data encoded by the probability table encoder 6. More specifically, the common data portions are divided into a leading portion side and a picture data sides, and inserted therebetween are the initial value flag and the probability table encoded data, in that order.

It should be noted that in this embodiment the probability table itself was encoded and embedded in the header as probability table-related data, but instead of this, information indicating the obtained probability table (for example, a formula, a flag indicating the probability table, or information indicating a combination of these) may be encoded and embedded in the header. In this case, the amount of encoding can be reduced because the probability table itself is not encoded.

As a further example of information indicating the obtained probability table, it is possible to use a portion of common data in the header. In this case, the amount of encoding can be further reduced because that data also functions as a portion of common data in the unit data. When the unit of data is a picture, examples of common data include image encoding types (distinguishing between intra-coded pictures, predictive coded pictures, and bi-predictive pictures), and initial values of picture quantization parameters. It should be noted that common data without much relation to initialization includes parameters such as the order of image encoding, the order of picture display, motion vectors, and image size. When the unit of data is a slice, examples include slice encoding types (distinguishing between intra-coded slices, predictive coded slices, and bi-predictive slices), and initial values of slice quantization parameters. Furthermore, the initial value flag may be omitted by ensuring that initial values are always updated, that is, by ensuring that initial values are always sent.

(3) Configuration of Variable-Length Decoding Device

[1] Variable-Length Decoding Device According to the Present Invention

Figure 9:
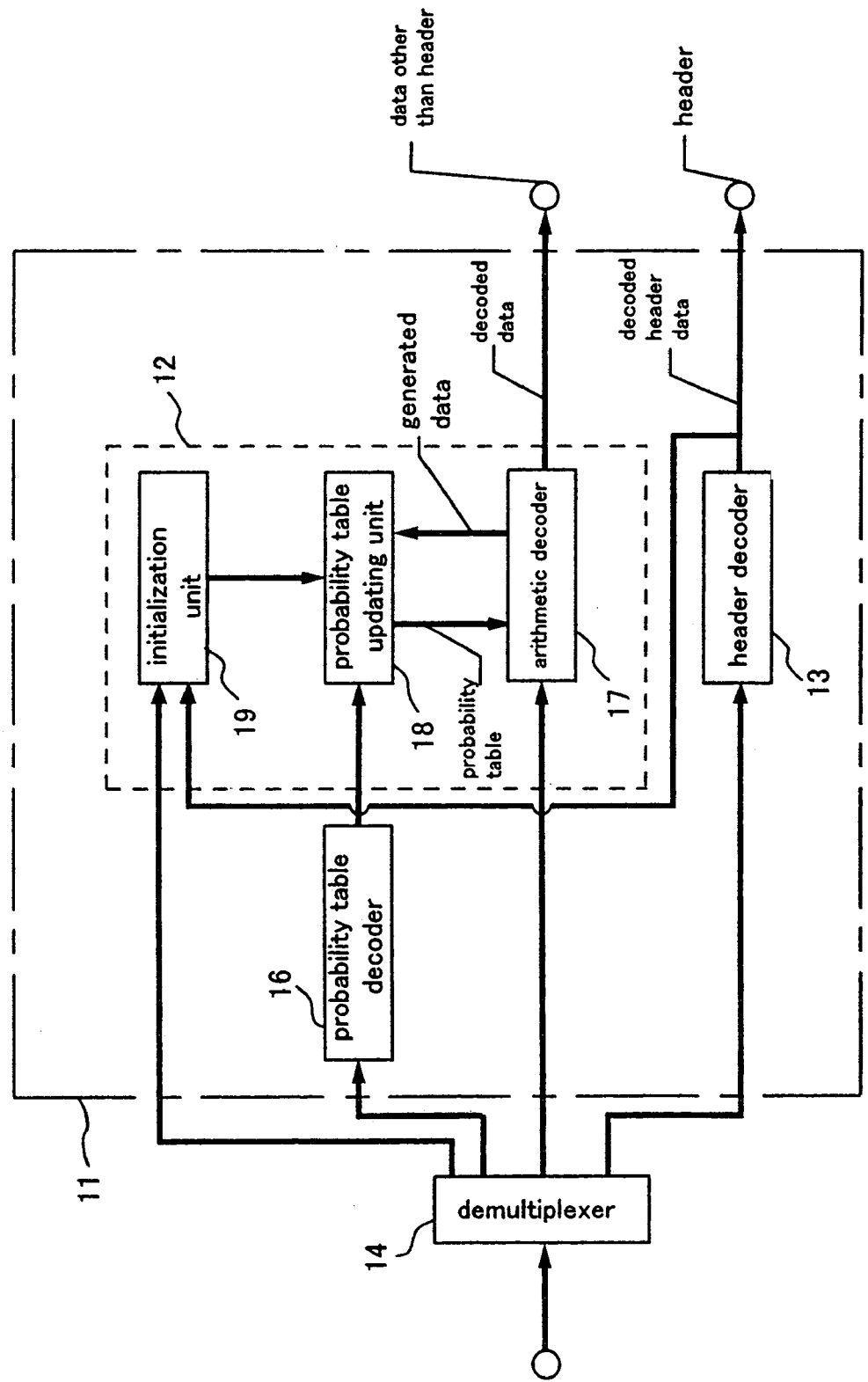
FIG. 9 is a block diagram showing the overall configuration of a variable-length decoding device according to the first embodiment of the present invention.

FIG. 9 is a block diagram showing the overall configuration of a variable-length decoding device 11 according to one embodiment of the present invention. The variable-length decoding device 11 is, for example, a device for decoding data that has been encoded by the variable-length encoding device 1. When the object is image data, the variable-length decoding device 11 has the functions of performing entropy decoding of data and obtaining transformed image data.

The variable-length decoding device 11 is primarily provided with a data decoding unit 12 and a header decoding unit 13.

The data decoding unit 12 is a device for performing arithmetic decoding on data other than the header of each unit data, and is provided with an arithmetic decoder 17, a probability table updating unit 18, and an initialization unit 19. It should be noted that the unit of data referred to here in the case of image data means a picture or a slice.

The arithmetic decoder 17 is a device for outputting generated data to the probability table updating unit 18 after encoded data is input, and decoding encoded data based on the probability table data, i.e., code words, that is output from the probability table updating unit 18.

The probability table updating unit 18 has the function of updating the probability tables, and is a device for outputting the probability table, i.e., the code words, to the arithmetic decoder 17 while updating the probability table in response to the probability of generated data that is output from the arithmetic decoder 17.

The initialization unit 19 is a device for outputting an initialization instruction from the probability table to the probability table updating unit 18.

The header decoder 13 is a device for decoding encoded header data with a fixed decoding method.

The variable-length decoding device 11 is further provided with a probability table decoder 16. The probability table decoder 16 is a device for decoding encoded probability table data with a fixed decoding method.

A demultiplexer 14 is a device for demultiplexing and outputting a bit stream as encoded header data, encoded data other than headers, and encoded probability table data.

[2] Standard Image Decoding Device

Figure 10:
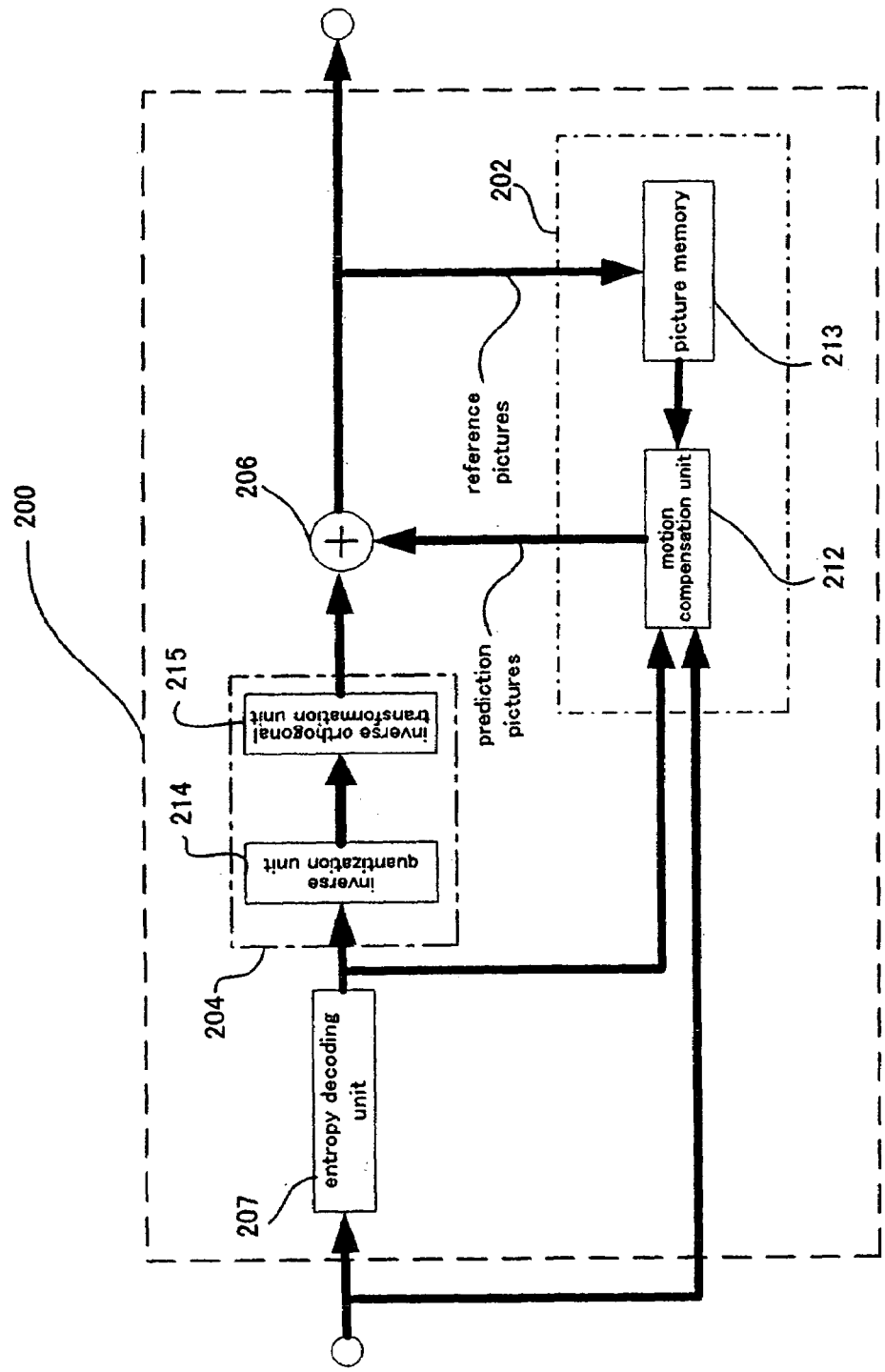
FIG. 10 is a block diagram showing the overall configuration of a standard image decoding device.

Here, the block diagram of FIG. 10 will be used to illustrate an internal configuration of a standard image decoding device 200. The image decoding device 200 includes a prediction data generating unit 202, a conversion decoding unit 204, an adder 206, and an entropy decoding unit 207. It should be noted that the data decoding unit 12 that was mentioned earlier corresponds to the entropy decoding unit 207.

The entropy decoding unit 207 carries out entropy decoding of the stream data that is input, based on the probability table, and outputs that data to the conversion decoding unit 204 and the prediction data generating unit 202. Entropy decoding is a process in the reverse direction (a reverse process) of entropy encoding, and refers to arithmetic decoding in this embodiment.

The prediction data generating unit 202 includes a motion compensation unit 212 and a picture memory 213. The output pictures from the adder 206 are output as reference pictures and stored in the picture memory 213. Based on the motion vectors MV decoded by the entropy decoding unit 207, the motion compensation unit 212 generates picture data as prediction pictures (motion compensation) corresponding to the motion vectors MV from the reference pictures stored in the picture memory 213, and outputs this to the adder 206. It should be noted that when encoding intra-coded pictures, the pixel values of the motion compensated reference picture are taken as 0, and the adder 206 outputs the input data as is without performing additions. Furthermore, the decoded motion vectors are stored in the picture memory 213.

The conversion decoding unit 204 carries out data expansion processing on the output from the entropy decoding unit 207; and outputs expanded data. The conversion decoding unit 204 includes an inverse quantization unit 214 and an inverse orthogonal transformation unit 215. The inverse quantization unit 214 inversely quantizes the output from the entropy decoding unit 207, and outputs that to the inverse orthogonal transformation unit 215. The inverse orthogonal transformation unit 215 carries out inverse discrete cosine transformation processing (IDCT processing) on the output from the inverse quantization unit 214, and outputs the expanded data to the adder 206. IDCT processing is a process in which data of the frequency domain is transformed into data of the spatial domain.

The adder 206 outputs, as output pictures, the picture data obtained by adding the picture data from the conversion encoding unit 204, and the picture data added with the estimation picture from the motion compensation unit 212, and also outputs the result to the picture memory 213.

(4) Operation of Variable-Length Decoding Device

[1] Operation of Demultiplexer

The demultiplexer 14 demultiplexes a bit stream, outputs encoded header data to the header decoder 13, outputs encoded data other than headers to the arithmetic decoder 17, and outputs encoded probability table data to the probability table decoder 16 when there is encoded probability table data. It should be noted that the header decoder 13 outputs the decoded initial value flag of the header to the initialization unit 19.

[2] Operation of Header Decoder

The header decoder 13 decodes the encoded header data that is output from the demultiplexer 14, and outputs header data.

[3] Operation of Data Decoding Unit and Probability Table Encoder

Figure 11:
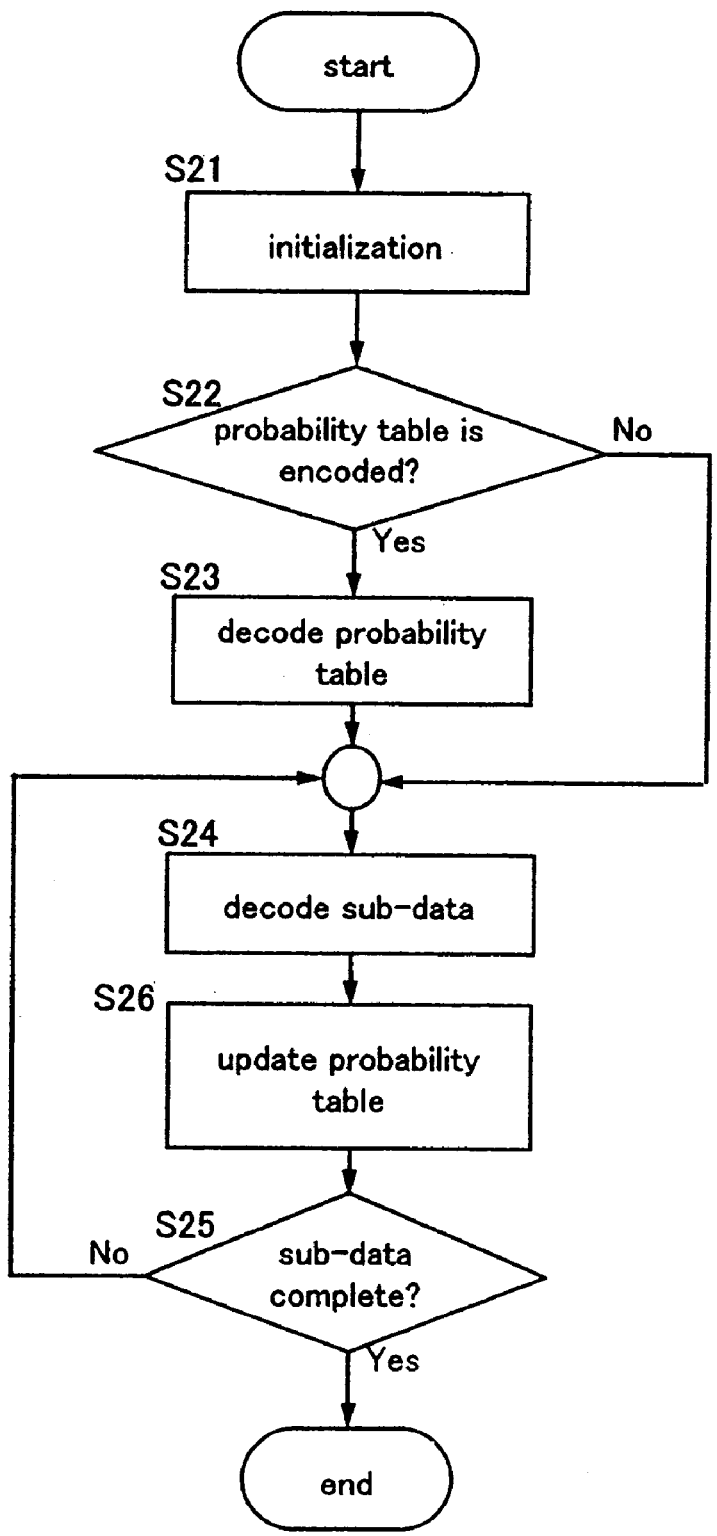
FIG. 11 is a flowchart showing an outline of the operation of a data decoding unit.

FIG. 11 is a flowchart showing an outline of the operation of the data decoding unit 12 and the probability table decoder 16.

In step S21, the initialization unit 19 initializes the probability table updating unit 18 so as to set a probability table to initial values.

In step S22, based on the initial value flag embedded in the header, the initialization unit 19 determines whether or not the probability table is encoded. If it is determined that the probability table is encoded, the procedure proceeds to step S23, and if it is determined that the probability table is not encoded, the procedure skips step S23 and proceeds to step S24.

In step S23, the probability table updating unit 18 updates the probability table with the probability table that is output from the probability table decoder 16. The encoded probability table data that is input to the probability table decoder 16 is sometimes the entire probability table, and sometimes a portion of the probability table. Even when only a portion of the probability table is encoded, if the portion corresponding to the encoded data with a high probability in the obtained probability table is encoded, proper decoding can be achieved in a decoding operation (that will be described below). It should be noted that when only a portion of the code table is encoded, the probability table that is not encoded is initialized with the same values as in step S21.

It should also be noted that when information indicating the probability table is encoded and is not the probability table itself, that information is first decoded, and then the probability table updating unit 18 selects the probability table which is indicated by that data.

In step S24, the arithmetic decoder 17 and the probability table updating unit 18 cooperate to perform arithmetic decoding on sub-data. Specifically, based on the probability table from the probability table updating unit 18, the arithmetic decoder 17 decodes the encoded sub-data, and outputs data. When the unit of data is a picture, for example, the slices are decoded. In step S26, the generated data of the arithmetic decoder 17 is output to the probability table updating unit 18, and the probability table updating unit 18 rewrites the probability table with the generated data. The updated probability table is used in the decoding of the next sub-data in step S24.

In step S25, it is determined whether or not the decoding of all the sub-data is complete. If it is determined that the decoding of all the sub-data is not complete, the procedure returns to step S24, and the above-described operation is repeated.

(5) Effectiveness of Above-Described Encoding Method and Decoding Method

[1] Compression efficiency is improved with the above-described encoding and decoding methods because the sub-data are encoded based on the probability table obtained by arithmetic encoding. In other words, with these encoding and decoding methods, compression efficiency can be increased due to the high learning efficiency, even if the total amount of data is small and thus the proportion of the amount of encoded data that would be required with conventional methods until optimal encoding is obtained by learning is considerable.

Furthermore, because the initialized probability table is encoded and placed in the header of the encoded unit data, the encoded unit data can be properly decoded during decoding with that probability table as the initial values.

[2] The frequency with which the probability table is encoded is appropriate with the above-described encoding and decoding methods, since the probability table is encoded in picture or slice units. First, even if a portion of encoded data that should be used in learning is lost in a transmission error, and the same probability table as that of the time of encoding cannot be reproduced when decoding, a state in which images are not playable does not last for more than several seconds as the encoded probability table is decoded with high frequency. If encoding in stream or GOP units, the frequency of encoding the probability table is low, and when a portion of encoded data that should be used in learning is lost in a transmission error and the probability table cannot be reproduced, a condition is created in which images are not playable for more than several seconds. Second, there will not be a large amount of redundant probability table data. If encoding in block (or macroblock) units, the redundancy of the initialization data will become too large.

[3] High compression efficiency for the main part of the image data is achieved with arithmetic encoding in the above-described encoding and decoding methods. In contrast to this, the headers, which are common data, are simply and statically encoded with a fixed encoding method. More particularly, original header portions in the header are encoded with a fixed encoding method, and inserted probability table initial values are also encoded with a fixed encoding method. Because the compression efficiency for headers is always low as compared to the main part of the image data, there is no particularly large problem in using a fixed encoding method in terms of the overall compression efficiency.

2. Second Embodiment (1) Configuration of Variable-Length Encoding Device

Figure 12:
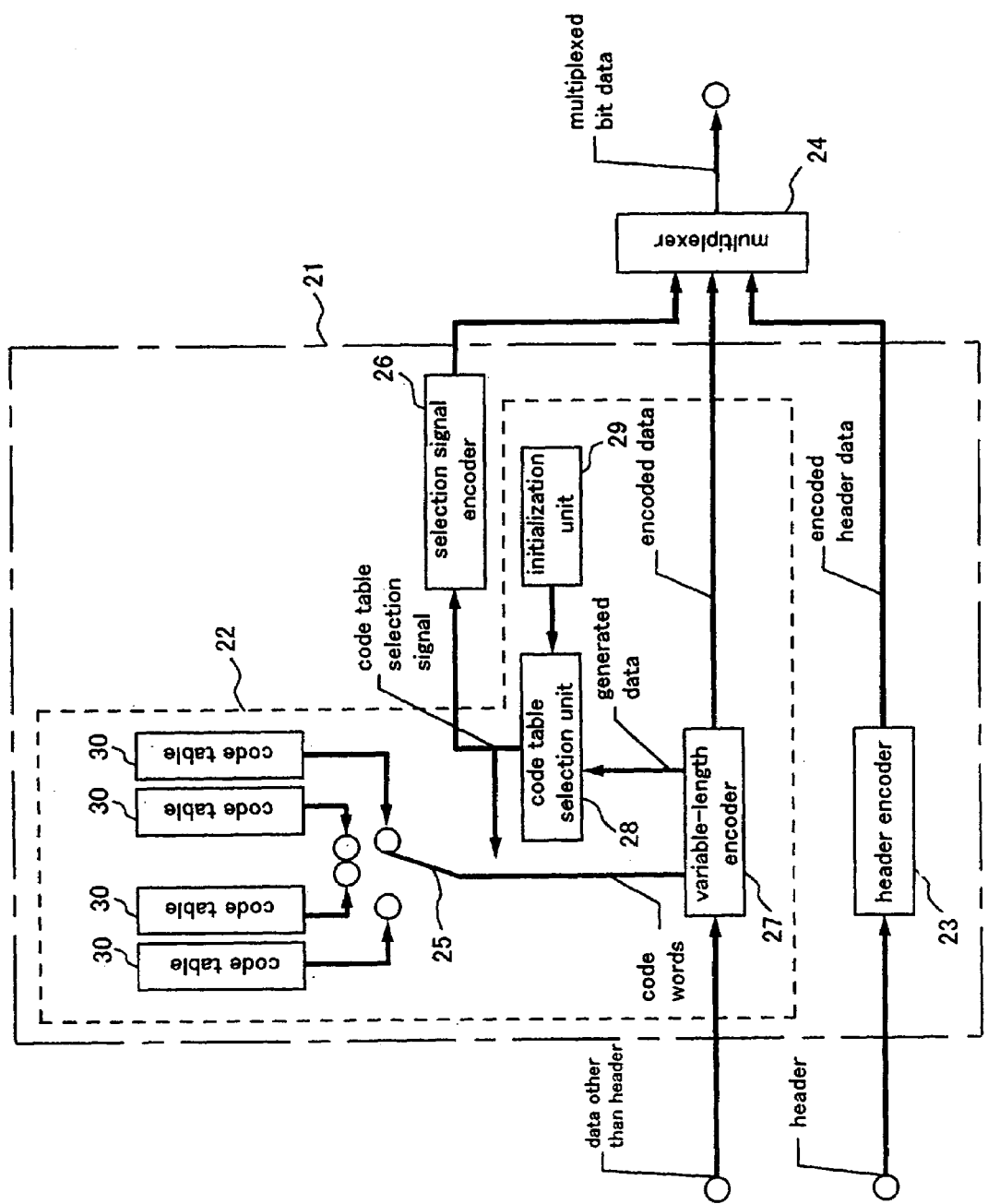
FIG. 12 is a block diagram showing the overall configuration of a variable-length encoding device according to a second embodiment of the present invention.

FIG. 12 is a block diagram of the overall configuration of a variable-length encoding device 21 according to an embodiment of the present invention. The variable-length encoding device 21 is a device for performing variable-length encoding on input data, and creating bit streams. In particular, the variable-length encoding device 21 is characterized in that it switches between a plurality of variable-length code tables as a primary method of encoding. A typical example of variable-length encoding is Huffman encoding, and the following explanation will use Huffman encoding as an example.

Various types of input data are possible for the variable-length encoding device 21, but this embodiment will be described as one in which image data are input. That is, the variable-length encoding device 21 has a function that performs entropy encoding on picture signals that have been converted into data. With the MPEG scheme in particular, the picture data that is input to the variable-length encoding device 21 is quantized DCT coefficients and motion vectors.

The variable-length encoding device 21 includes a data encoding unit 22 and a header encoder 23.

The data encoding unit 22 is a device for performing Huffman encoding of data other than headers for each unit data, and includes a variable-length encoder 27, a code table selection unit 28, and an initialization unit 29. It should be noted that the unit data is composed of a plurality of sets of sub-data. When the unit data is a picture, the sub-data is slices, macroblocks, or blocks, and when the unit of data is a slice, the sub-data is macroblocks or blocks. Furthermore, the data encoding unit 22 corresponds to the entropy encoding unit 107 in the standard image encoding device 100 shown in FIG. 2.

The variable-length encoder 27 is a device for outputting generated data to the code table selection unit 28 after data is input, and for encoding data based on the variable-length code tables 30, i.e., the code words, that are switched by the code table selection unit 28.

The code table selection unit 28 is a device for outputting a code table selection signal to a switch 25 in response to the probability of generated data output from the variable-length encoder 27.

The switch 25 is a device for switching the variable-length code tables 30 that are used when the variable-length encoder 27 encodes data in accordance with the code table selection signal that is output from the code table selection unit 28.

The initialization unit 29 is a device for outputting an initialization instruction of the code table selection signal to the code table selection unit 28.

FIG. 13 shows specific examples of variable-length code tables 30. Each of the variable-length code tables 30a to 30c is composed of a combination of data and bit strings that correspond to that data. Common bit strings are employed in the white portions of the variable-length code tables 30a to 30c (from data 1 in code table 30a, from data 2 in code table 30b, and from data 4 in code table 30c). Furthermore, different bit strings are employed in the common portions (data 0 in code table 30a, data 0 and 1 in code table 30b, data 0 to 3 in code table 30c). The data of the common portions is data with a comparatively high probability. If data with a high probability can be processed with one bit, code table 30a is selected, if data with a high probability can be processed with two bits, code table 30b is selected, and if codes with a high probability can be processed with three bits, code table 30c is selected. In contrast to this, the codes of the white portions are for data with a relatively low probability. In this way, by arranging common bit strings for data with a relatively low probability, different variable-length code tables can be prepared with a small amount of data to reduce memory, and moreover, the encoding operation will become easier.

The header encoder 23 is a device for encoding header data with a fixed encoding method.

The variable-length encoding device 21 is further provided with a selection signal encoder 26. The selection signal encoder 26 is a device for encoding the code table selection signals that are output from the code table selection unit 28 with a fixed encoding method.

A multiplexer 24 is a device for multiplexing the encoded header data that is output from the header encoder 23, the encoded data other than headers that is output from the variable-length encoder 27 and the encoded selection signal data that is output from the selection signal encoder 26, and for generating code strings (bit streams) and outputting these to a transmission line.

(2) Operation of Variable-Length Encoding Device

[1] Operation of Data Encoding Unit and Selection Signal Encoding Device

Figure 14:
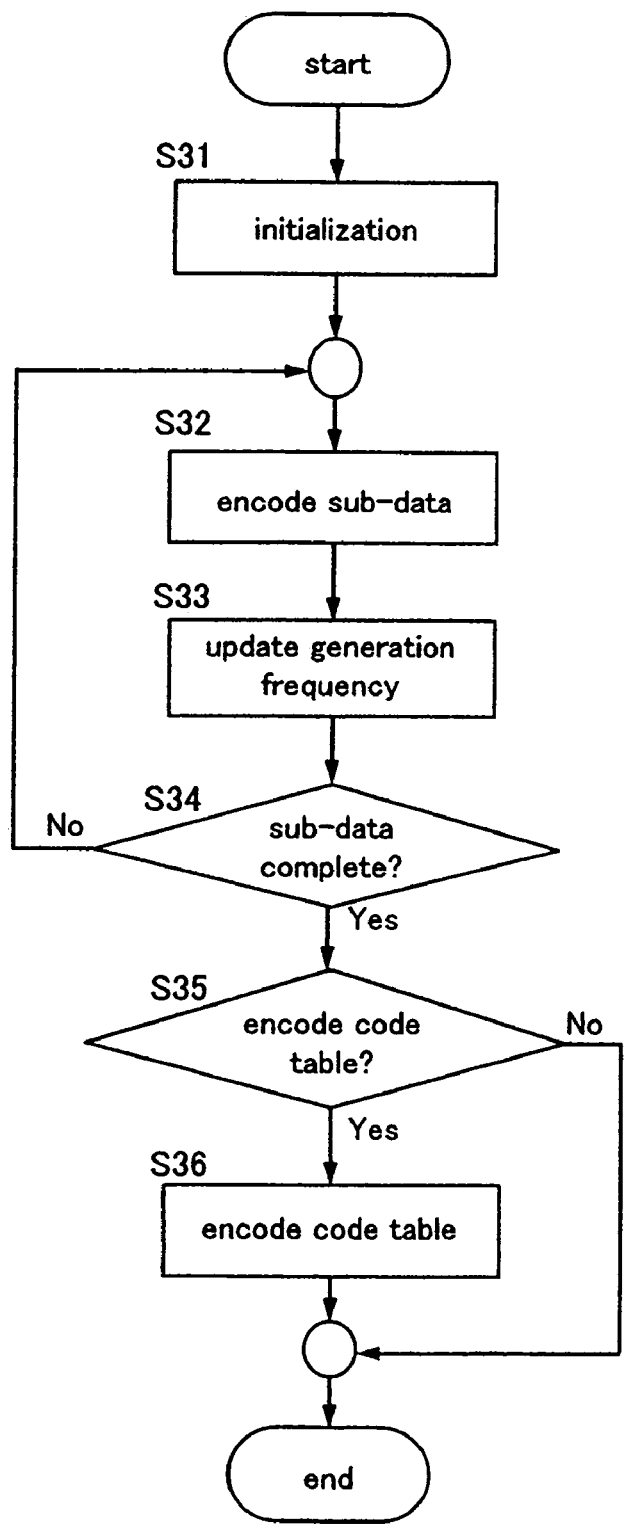
FIG. 14 is a flowchart showing an outline of the operation of a data encoding unit.

FIG. 14 is a flowchart showing an outline of the operation of the data encoding unit 22 and the selection signal encoder 26.

In step S31, the initialization unit 29 outputs an initialization instruction to the code table selection unit 28, and the code table selection unit 28 outputs a code table selection signal to the switch 25. The result of this is that the switch 25 selects a variable-length code table 30 as the initial values of the encoding of the unit data. In this initializing operation, the initialization unit 29 and the code table selection unit 28 select a variable-length code table 30 based on initialization data in the header. It should be noted that the line by which header data is sent to the initialization unit 29 and the code table selection unit 28 is omitted in FIG. 12.

In step S32, the variable-length encoder 27 and the code table selection unit 28 cooperate to perform Huffman encoding of sub-data. More specifically, the code table selection unit 28 outputs a code table selection signal to the switch 25 based on data generated up until that point. Based on the code table selection signal, the switch 25 switches the variable-length code tables 30, and the variable-length encoder 27 encodes the sub-data with the code words of the selected variable-length code table 30. Furthermore, each unit data is composed of a plurality of sets of sub-data. Specifically, slices, macroblocks, or blocks are encoded as sub-data when the unit of data is a picture, and macroblocks or blocks are encoded as sub-data when the unit of data is a slice.

In step S33, sub-data are output to the code table selection unit 28, and the code table selection unit 28 updates the generation frequency of sub-data, which indicates which code table should be selected when the switch 25 next performs a switch. In this embodiment, this code table is used when variable-length encoding is performed on the next sub-data.

In step S34, it is determined whether or not the encoding of all the sub-data is complete. If it is determined that the encoding of all the sub-data is not complete, the procedure returns to step S32 and the above-described operation is repeated.

In step S35, it is determined whether or not to encode the information that indicates the variable-length code table 30 used for the initial values (that is, the code table selection signals). If this information is to be encoded, the procedure proceeds to step S36, and if this information is not to be encoded, step S36 is skipped. It should be noted that the variable-length code table used for the initial values is not encoded in such cases when, for example, the amount of data until the next variable-length code table is initialized is sufficiently large (in other words, the proportion of the amount of data required for learning to the total amount of data is sufficiently small, and the efficiency of learning is therefore good), or when the variable-length code table used as initial values is consistent with the optimal code table selected by learning. The variable-length encoder 27 generates an initial value flag for identifying the result of the determination, and outputs that along with the encoded data to the multiplexer 24.

In step S36, the code table selection signals by which the code table selection unit 28 indicates the concerned variable-length code table are output to the selection signal encoder 26.

Compression efficiency for sub-data is improved by the above-described encoding method because, except for the first encoding of sub-data, the variable-length code table is selected based on the encoded sub-data values. In particular, because the variable-length code table used in encoding sub-data is a variable-length code table selected by Huffman encoding of the previous sub-data, encoding can be achieved in real time, and the encoding speed will be increased. Moreover, favorable compression efficiency can be obtained with spatial and temporal correlation of the pictures.

[2] Operation of Header Encoding Unit

The header encoder 23 encodes the inputted header data, and outputs that to the multiplexer 24.

[3] Operation of Multiplexer

The multiplexer 24 generates a bit stream from the data that is output from the variable-length encoder 27, the header encoder 23, and the selection signal encoder 26, and outputs this to a transmission line.

Figure 15:
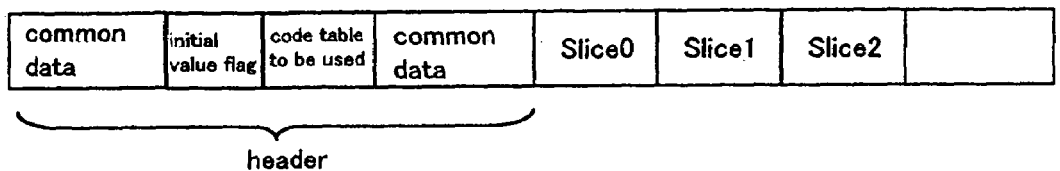
FIG. 15 shows bit stream data structures generated by a variable-length encoding device.
Figure 15:
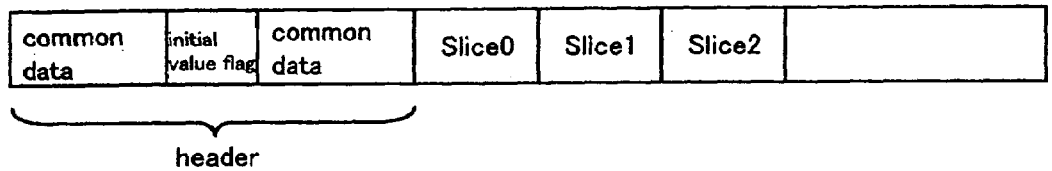

FIG. 15 shows bit stream data structures that are output from the multiplexer 24 when the unit of data is a picture of image data. A picture is generally composed of a header, and a plurality of slices as encoded sub-data. The header indicates the beginning of encoded data of one picture and has common data for each slice (for example, the image encoding type [distinguishing between intra coded pictures, predictive coded pictures, and bi-predictive coded pictures], and initial values of picture quantization parameters). It should be noted that common data without much relation to initialization includes parameters such as the order of image encoding, the order of picture display, motion vectors, and image size.

An initial value flag is placed in the header. The initial value flag is a flag for identifying whether or not the information that indicates the variable-length code table is encoded. If the information that indicates the variable-length code table is encoded, the flag is "1," and if not encoded, the flag is "0."

Furthermore, as shown in FIG. 15(a), encoded selection signal data (for example, a formula, a flag indicating a probability table, or information indicating a combination of these) that indicates the variable-length code table to be used is placed in the header. It should be noted that when the information that indicates the variable-length code table is not encoded, encoded selection signal data is not output from the selection signal encoder 26 to the multiplexer 24, and thus the result is that encoded selection signal data is not placed in the bit stream as shown in FIG. 15(b).

As described above, the header includes common data portions (which are originally in the header portion) that are encoded by the header encoder 23, an initial value flag generated by the variable-length encoder 27, and encoded selection signal data encoded by the selection signal encoder 26. More particularly, the common data portions are divided into a leading portion side and a picture data side, and inserted therebetween these are the initial value flag and the encoded selection signal data, in that order.

Figure 16:
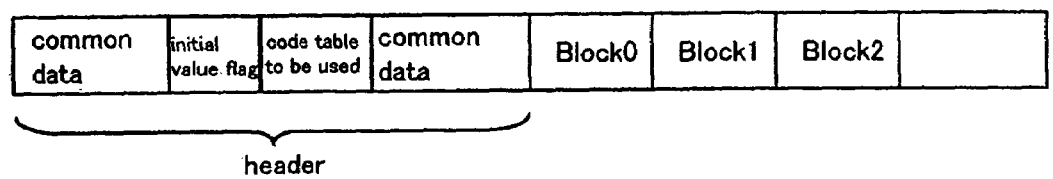
FIG. 16 shows bit stream data structures generated by a variable-length encoding device.
Figure 16:
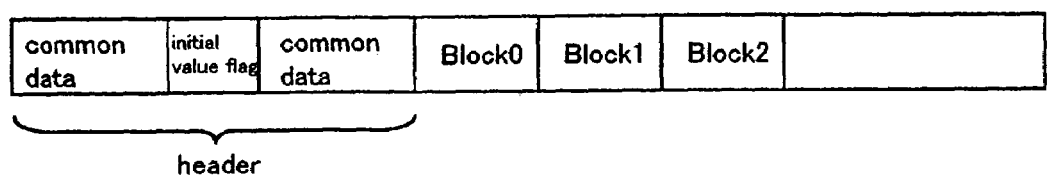

FIG. 16 shows the data structure of a bit stream that is output from the multiplexer 24 when the unit of data is a slice of image data. A slice is generally composed of a header and a plurality of blocks (or macroblocks) as encoded sub-data. The header indicates the beginning of encoded data in one slice and is primarily composed of the common data for each slice (parameters such as a starting code, and a quantization scale).

Examples of common data include slice encoding types (distinguishing between intra coded slices, predictive coded slices, and bi-predictive coded slices), and initial values of slice quantization parameters.

Furthermore, an initial value flag is placed in the header. The initial value flag is a flag for identifying whether or not the information that indicates the variable-length code table is encoded. If the information that indicates the variable-length code table is encoded, the flag is "1," and if not encoded, the flag is "0."

Moreover, as shown in FIG. 16(a), encoded selection signal information that indicates the variable-length code table to be used is placed in the header. It should be noted that when the variable-length code table is not encoded, encoded selection signal data is not output from the selection signal encoder 26 to the multiplexer 24, and thus the result is that encoded selection signal data is not placed in the bit stream as shown in FIG. 16(b).

As described above, the header includes common data portions (which are originally in the header portion) that are encoded by the header encoder 23, an initial value flag generated by the variable-length encoder 27, and encoded selection signal data encoded by the selection signal encoder 26. More particularly, the common data portions are divided into a leading portion side and a picture data side, and inserted therebetween are the initial value flag and encoded selection signal information, in that order.

It should be noted that in this embodiment the variable-length code table itself was not encoded and embedded in the header, but instead of this, encoded selection signal information indicating the variable-length code table to be used was embedded in the header. Consequently, the amount of encoding can be reduced because the variable-length code table itself is not encoded.

As a further example of encoded selection signal information indicating the variable-length code table to be used, it is possible to use a portion of common data in the header. In this case, the amount of encoding can be further reduced because that data also functions as a portion of common data in the unit of data. When the unit of data is a picture, examples of common data include image encoding types (distinguishing between intra-coded pictures, predictive coded pictures, and bi-predictive coded pictures), and initial values of picture quantization parameters. It should be noted that common data without much relation to initialization includes parameters such as the order of image encoding, the order of picture display, motion vectors, and image size. When the unit of data is a slice, examples include slice encoding types (distinguishing between intra-coded slices, predictive coded slices, and bi-predictive coded slices), and initial values of slice quantization parameters.

Furthermore, the initial value flag may be omitted by ensuring that initial values are always updated.

(3) Configuration of Variable-Length Decoding Device

Figure 17:
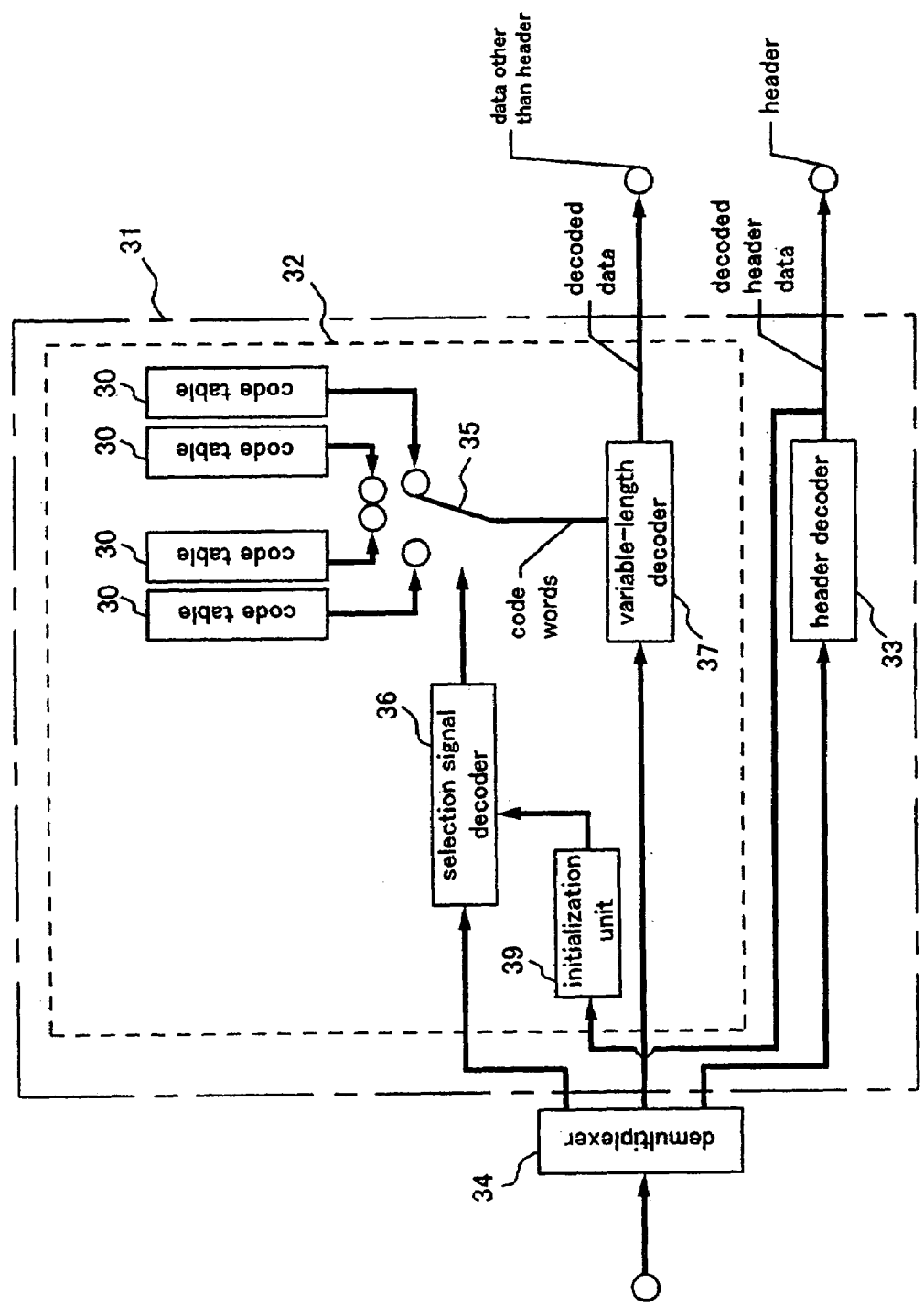
FIG. 17 is a block diagram showing the overall configuration of a variable-length decoding device according to the second embodiment of the present invention.

FIG. 17 is a block diagram showing the overall configuration of a variable-length decoding device 31 according to one embodiment of the present invention. The variable-length decoding device 31 is, for example, a device for decoding data that has been encoded by the variable-length encoding device 21. When the object is image data, the variable-length decoding device 31 has the functions of performing entropy decoding of data, and obtaining transformed image data.

The variable-length decoding device 31 includes a data decoding unit 32 and a header decoding unit 33.

The data decoding unit 32 is a device for performing Huffman decoding on data other than the header of each unit data, and is provided with a variable-length decoding device 37, and a selection signal decoder 36. It should be noted that the unit of data referred to here in the case of image data means a picture or a slice. Furthermore, the data decoding unit 32 corresponds to the entropy decoding unit 207 in the standard image encoding device 200 shown in FIG. 10.

The variable-length decoding device 37 is a device for decoding encoded data based on the code words of the variable-length code tables 30, which was switched by a switch 35.

The selection signal decoder 36 is a device for decoding the encoded selection signal data that is output from a demultiplexer 34 with a fixed decoding method, and outputting that to the switch 35.

The switch 35 is a device for switching the variable-length code tables 30 that are used when the variable-length decoding device 37 decodes data in accordance with the code table selection signal that is output from the selection signal decoding unit 36.

The initialization unit 39 is a device for outputting initialization instructions to the selection signal decoding unit 36.

The header decoder 33 is a device for decoding encoded header data with a fixed decoding method.

A demultiplexer 34 is a device for demultiplexing and outputting a bit stream as encoded header data, encoded data other than headers, and encoded selection signal data.

(4) Operation of Variable-Length Decoding Device

[1] Operation of Demultiplexer

The demultiplexer 34 demultiplexes a bit stream, outputs encoded header data to the header decoder 33, outputs encoded data other than headers to the variable-length decoding device 37, and outputs encoded selection signal data to the selection signal decoder 36 when there is encoded selection signal data. It should be noted that the header decoder 33 outputs the initial value flag of the header to the initialization unit 39.

[2] Operation of Header Decoder

The header decoder 33 decodes the encoded header data that is output from the demultiplexer 34, and outputs header data.

[3] Operation of Data Decoding Unit

Figure 18:
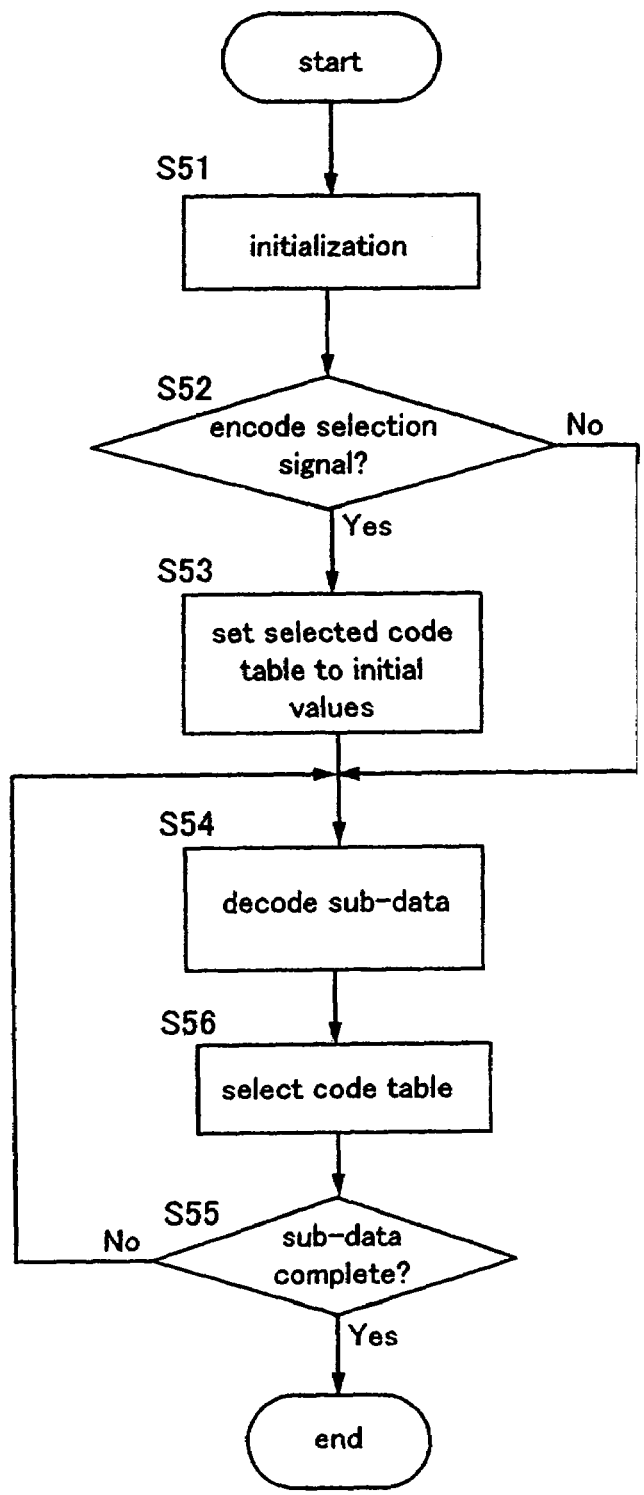
FIG. 18 is a flowchart showing an outline of the operation of a data decoding unit.

FIG. 18 is a flowchart showing an outline of the operation of the data decoding unit 32.

In step S51, the initialization unit 39 outputs initialization instructions to the selection signal decoder 36, and the selection signal decoder 36 outputs a code table selection signal to the switch 35. The result is that the switch 35 selects the variable-length code table 30 as the initial values for decoding the unit data.

In step S52, the variable-length decoding unit 37 determines whether or not the information that indicates the variable-length code table to be used is encoded, based on the initial value flag embedded in the header. If it is determined that the information indicating the variable-length code table is encoded, the procedure proceeds to step S53, and if it is determined that it is not encoded, the procedure skips step 53 and proceeds to step S54.

In step S53, the switch 35 selects the variable-length code table 30 that is indicated by the selection signal output from the selection signal decoder 36.

In step S54, the variable-length decoding device 37 performs Huffman decoding on sub-data. More specifically, based on the variable-length code table 30 selected by the switch 35, the variable-length decoding device 37 decodes the encoded sub-data, and outputs data. When the unit data is a picture, for example, the slices are decoded. In step S56, the variable-length decoding device 37 selects the variable-length code table 30 with the generated data via the switch 35. The selected variable-length code table 30 is used in the decoding of the next sub-data in step S54.

In step S55, it is determined whether or not the decoding of all the sub-data is complete. If it is determined that the decoding of all the sub-data is not complete, the procedure returns to step S52, and the above-described operation is repeated.

(5) Effectiveness of Above-Described Encoding Method and Decoding Method

[1] Compression efficiency is improved with the above-described encoding and decoding methods because the sub-data are encoded based on a variable-length code table obtained by Huffman encoding. In other words, with these encoding and decoding methods, compression efficiency can be increased with high learning efficiency, even if the total amount of data is small and thus the proportion of the amount of encoded data that would be required with conventional methods until optimal encoding is obtained by learning is considerable.

Furthermore, because the information that indicates the initialized code table is encoded and placed in the header of an encoded unit data, the encoded unit data can be properly decoded during decoding with the variable-length code table indicated by that information as the initial values.

[2] The frequency with which the information that indicates the variable-length code table is encoded is appropriate with the above-described encoding and decoding methods because the variable-length code table is encoded in picture or slice units. First, even when encoded selection signal data is lost in a transmission error, images will never be unplayable for more than several seconds because the encoded probability table is decoded with high frequency. When encoding in stream or GOP units, the information that indicates the variable-length code table is encoded at a low frequency, and when encoded selection signal data is lost in a transmission line error, images will not playable for more than several seconds. Second, there will not be a large amount of redundant information that indicates the variable-length code table. When encoding in block (or macroblock) units, redundant initialization data becomes too large.

[3] High compression efficiency for the main part of the image data is achieved with Huffman encoding switching between a plurality of variable-length code tables in the above-described encoding and decoding methods. In contrast to this, the headers (which are common data) are encoded with a fixed encoding method. More particularly, original header portions in the header are encoded with a fixed encoding method, and inserted information that indicates the variable-length code table is also encoded with a fixed encoding method. Because the compression efficiency for headers is always low as compared to the main part of the image data, there is no particularly large problem in using a fixed encoding method in terms of the overall compression efficiency.

3. Storage Medium Embodiment

By storing a program that executes the variable-length encoding method or the variable-length decoding method shown in the above-described embodiments on a storage medium such as a floppy disk, it is possible to easily execute the processes shown in the embodiments on an independent computer system.

Figure 19:
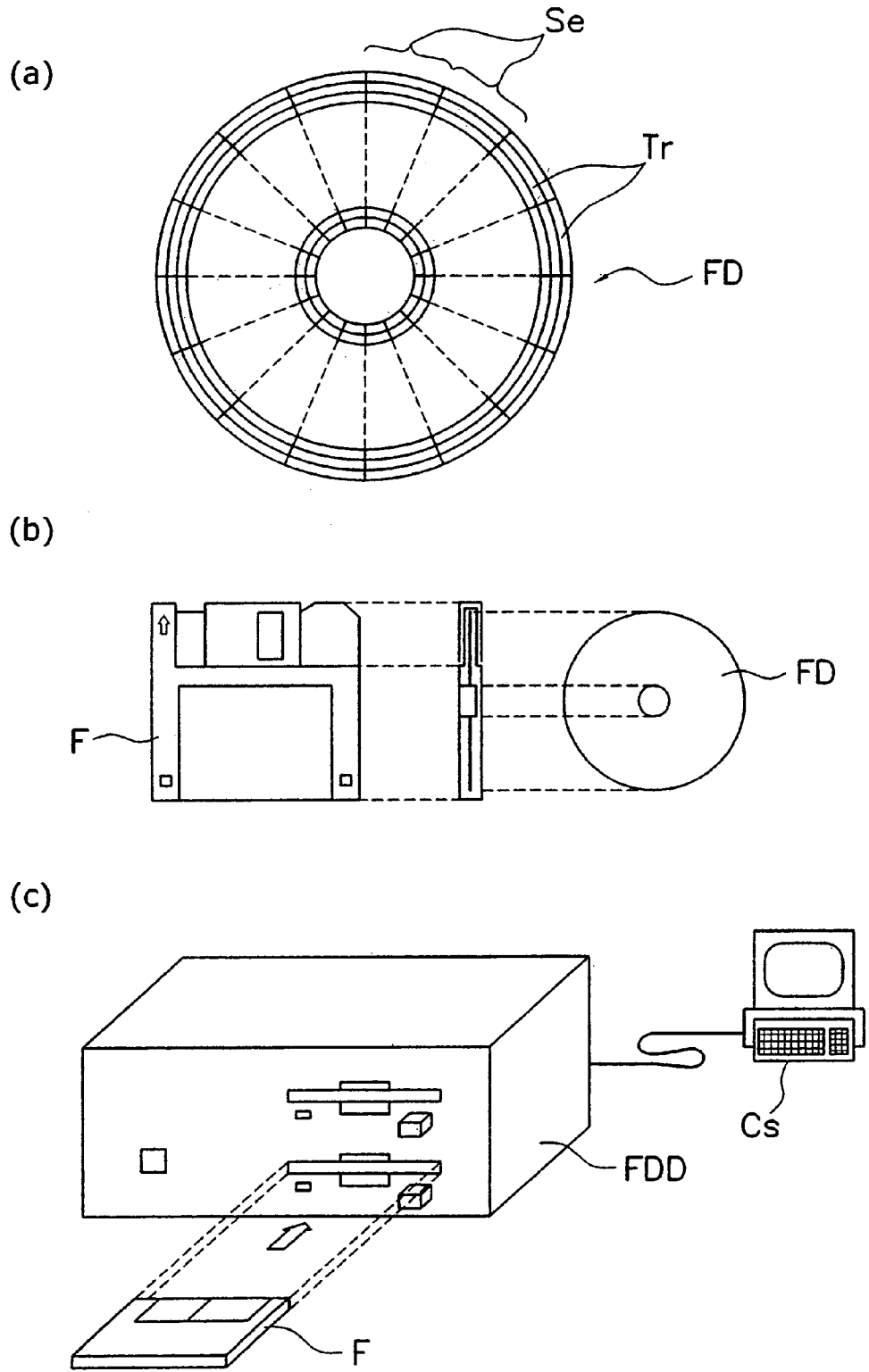
FIG. 19 illustrates a situation in which the present invention is executed on a computer system by using a floppy disk on which the variable-length encoding method or variable-length decoding method according to the first or second embodiments are stored.

FIG. 19 illustrates a case in which the present invention is executed on a computer system using a floppy disk on which a variable-length encoding method or variable-length decoding method of the above-described embodiments is stored.

FIG. 19(b) shows a front view of the external appearance of a floppy disk, a cross sectional view of the same, and a floppy disk. FIG. 19(a) shows an example of the physical format of a floppy disk (which is the primary portion of the storage medium). A floppy disk FD is built into a case F, and a plurality of tracks Tr are formed concentrically from the outer edge to the inner edge on the surface of the disk. Each track is divided in an angular orientation into 16 sectors Se. Thus, with a floppy disk on which the above-described program is stored, the variable-length encoding method or the variable-length decoding method will be recorded onto assigned regions of the floppy disk FD as the above-mentioned program.

Furthermore, FIG. 19(c) shows a configuration for recording and reproducing the program on the floppy disk FD. When recording the program on the floppy disk FD, the variable-length encoding method or the variable-length decoding method is written from a computer system Cs via a floppy disk drive. Furthermore, when constructing the variable-length encoding method of the variable-length decoding method on a computer system by means of the program on the floppy disk, the program is read from the floppy disk by a floppy disk drive FDD and transferred to a computer system.

It should be noted that a floppy disk is used as the storage medium to illustrate the explanation above, but an optical disk can also be similarly used. Furthermore, the storage medium is not limited to the aforementioned examples, and as long as it is a medium on which a recording can be made, such as a CD-ROM, a memory card, or a ROM cassette, the program can be executed in the same way.

4. Example Applications of the Present Invention and Systems that Use These

The following is an explanation of example applications of the moving image encoding methods and moving image decoding methods shown in the above-described embodiments, as well as systems that use these.

Figure 20:
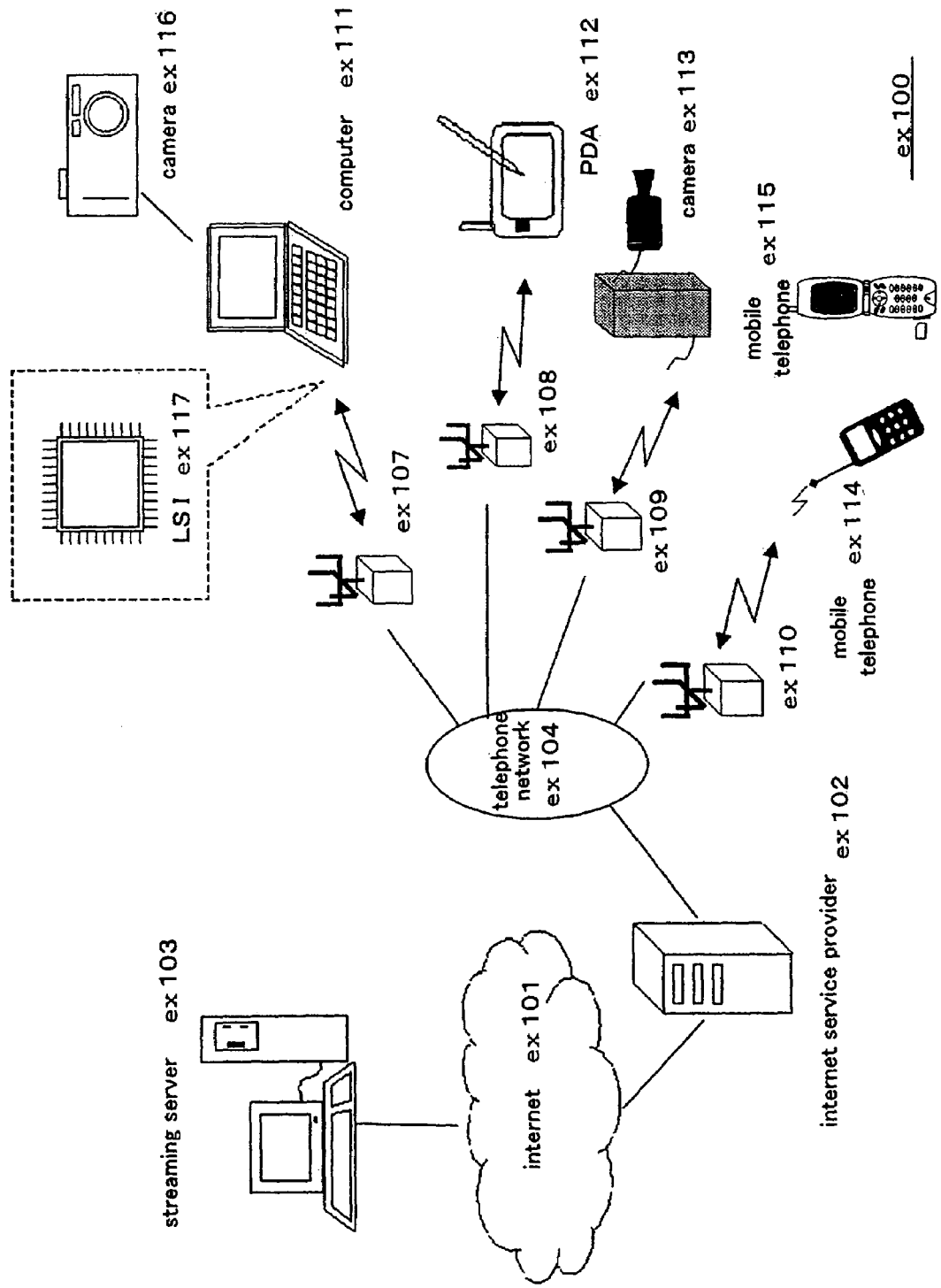
FIG. 20 is a block diagram showing the entire configuration of a content providing system.

FIG. 20 is a block diagram showing an entire configuration of a content providing system ex100 that effectuates a content providing service. Areas for providing communications services are divided into desired sizes, and base stations ex107 to ex110 (which are fixed wireless stations) are installed within the respective cells.

The content providing system ex100 connects, for example, a streaming server ex103 with an Internet service provider ex102 on the Internet ex101, and a telephone network ex104, as well as various devices such as a computer ex111, a PDA (personal digital assistant) ex112, a camera ex113, a mobile telephone ex114, and a camera-equipped mobile telephone ex115 via the base stations ex107 to ex110.

However, the content providing system ex100 is not limited to the arrangement shown in FIG. 17, and any combination of these devices may be arranged and connected. Furthermore, the devices may be directly connected by the telephone network ex104, and not via the base stations ex107 to ex110 (which are fixed wireless stations).

The camera ex113 is a device such as a digital video camera that is capable of capturing a moving image. Furthermore, the mobile telephones ex114, ex115 may be devices which operate on protocols such as PDC (Personal Digital Communications), CDMA (Code Division Multiple Access), W-CDMA (Wideband-Code Division Multiple Access), or GSM (Global System for Mobile Communications), PHS (Personal Handy phone System), and the like.

Furthermore, the streaming server ex103 may be connected to the camera ex113 through the base station ex109 and the telephone network ex104, and a user using the camera ex113 can make a live broadcast based upon encoded data. The processing for encoding the captured data may be performed by the camera ex113, or by a server or the like that transmits the data. Furthermore, moving picture data captured by a camera ex116 may be sent via the computer ex111 to the streaming server ex103. The camera ex116 is a device such as a digital camera that is capable of capturing still images and moving images. In this case, the encoding of the moving image data may be performed by the camera ex116 or the computer ex111. Furthermore, the encoding process is performed by an LSI chip ex117 which is provided in the computer ex111 or the camera ex116. It should be noted that software for encoding/decoding images may be incorporated onto any storage medium (such as CD-ROMs, flexible disks, and hard disks) that can be read by the computer ex111 or the like. Furthermore, moving image data may be transmitted by the camera-equipped mobile telephone ex115. When this occurs, the moving image data is data encoded by an LSI chip which is provided in the mobile telephone ex115.

With the content providing system ex100, content (for example, images capturing a live concert) that a user is capturing with the camera ex113, the camera ex116 or the like are encoded in the same way as in the above-described embodiments and transmitted to the streaming server ex103, and the streaming server ex103 streams the content to a client that has requested it. Examples of the client include devices capable of decoding the encoded data such as the computer ex111, the PDA ex112, the camera ex113, and the mobile telephone ex114. Thus, the content providing system ex100 is a system that makes it possible for a client to receive and reproduce encoded data. Furthermore, individual broadcasts can be achieved with the system by receiving, decoding and reproducing encoded data in a client.

The moving image encoding device or the moving image decoding device shown in the above-described embodiments may be used in the encoding and decoding devices that make up this system.

The following example describes the use of a mobile telephone with the present invention.

Figure 21:
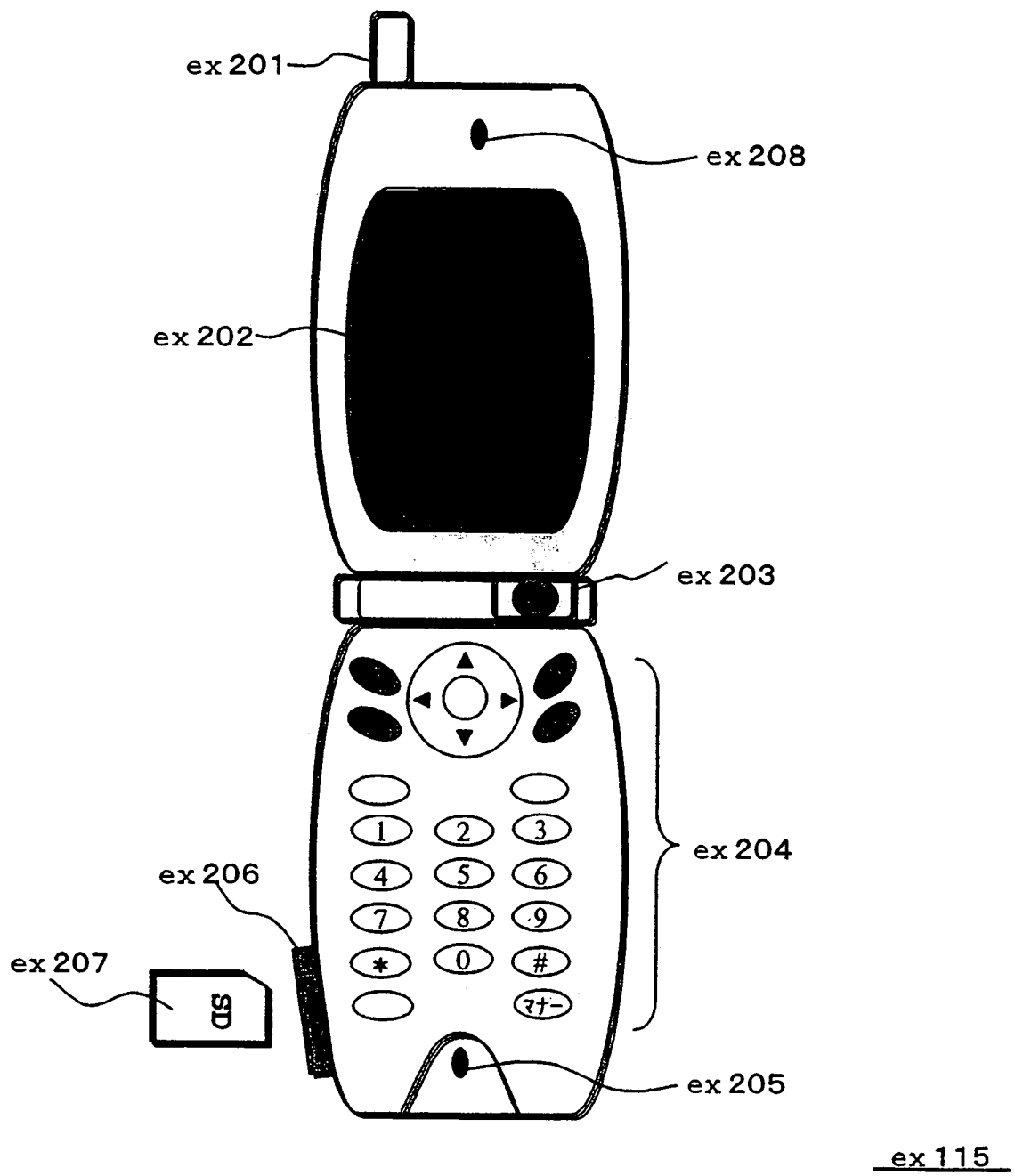
FIG. 21 shows an example of a mobile telephone that uses a moving image encoding method and a moving image decoding method.

FIG. 21 shows a mobile telephone ex115 that uses the moving image encoding method and the moving image decoding method described in the embodiments above. The mobile telephone ex115 is provided with an antenna ex201 for sending and receiving radio waves from and to the base station ex110, a camera unit ex203 such as a CCD camera that is capable of capturing images and still pictures, a display unit ex202 such as a liquid crystal display that displays decoded image data captured by the camera unit ex203 or received by the antenna ex201, a main unit composed of operation keys ex204, a voice output unit ex208 such as speakers for outputting voice, a voice input unit ex205 such as a microphone for inputting voice, a storage medium ex207 for saving encoded or decoded data such as captured moving image or still image data, received e-mail data, and moving image data or still image data, and a slot ex206 for enabling the storage medium ex207 to be equipped in the mobile telephone ex115. The storage medium ex207 is housed in a flash memory device, which is a type of EEPROM (Electrically Erasable and Programmable Read Only Memory) that is a nonvolatile memory housed in a plastic case and capable of being electrically rewritten and erased, such as an SD card.

Figure 22:
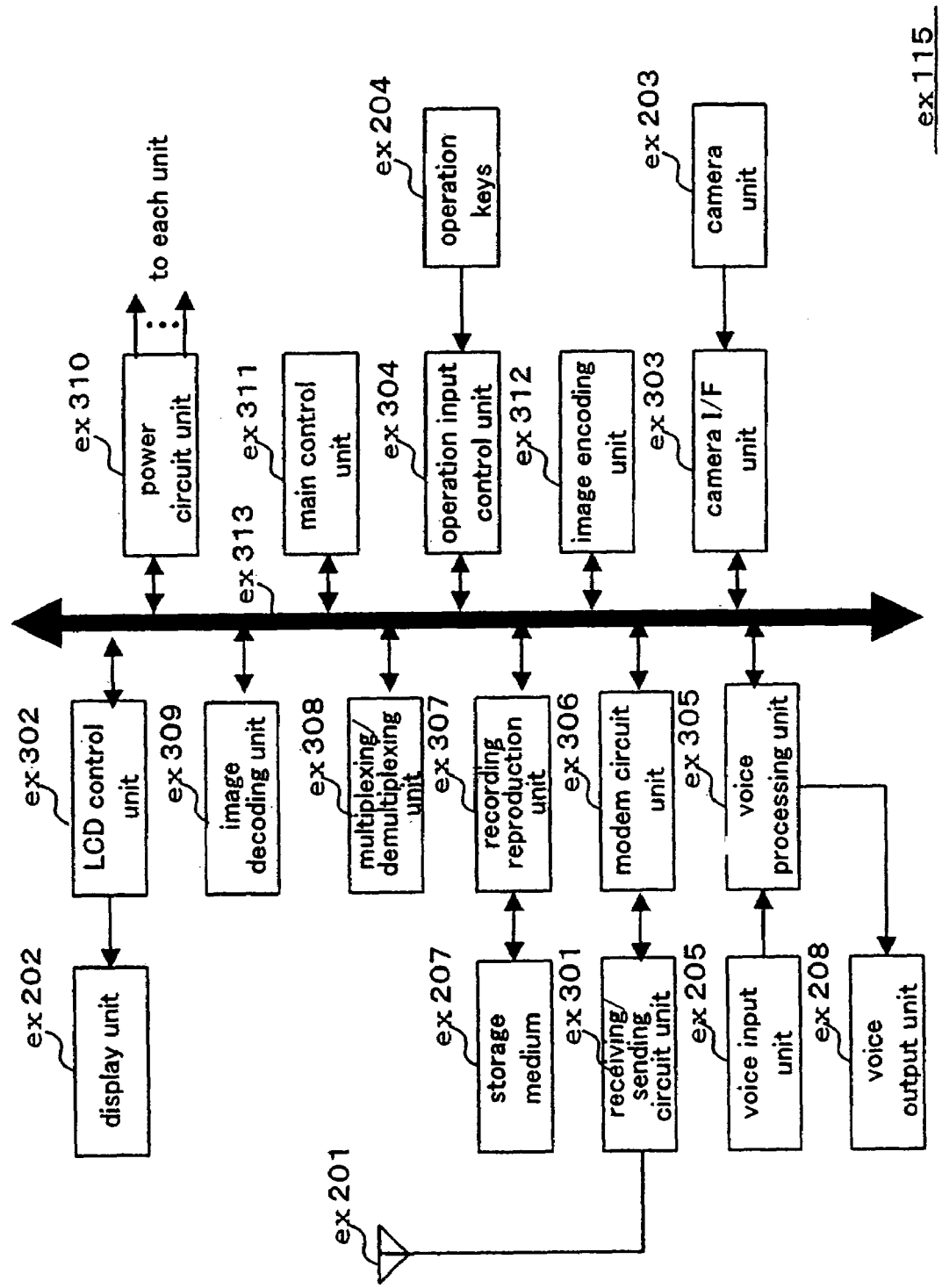
FIG. 22 is a block diagram of a mobile telephone.

The mobile telephone ex115 will be further described with reference to FIG. 22. A power circuit unit ex310, an operation input control unit ex304, an image encoding unit ex312, a camera interface unit ex303, an LCD (liquid crystal display) control unit ex302, an image decoding unit ex309, a multiplexing/demultiplexing unit ex308, a recording reproduction unit ex307, a modem circuit unit ex306, and a voice processing unit ex305 are interconnected via a synchronization bus ex313 to a main control unit ex311 that centrally controls each unit of the main unit provided with the display unit ex202 and the operation keys ex204.

When a call ends or the power key is turned on by the user, the power circuit unit ex310 supplies power to each unit from the battery pack, thus activating the camera-equipped digital mobile telephone ex115 for operation.

Based on the control of the main control unit ex311 (which includes a CPU, a ROM, a RAM, and the like), the mobile telephone ex115 converts the voice signals collected during a voice call mode by the voice input unit ex205 to digital voice data with the voice processing unit ex305, and these undergo spread spectrum processing by the modem circuit unit ex306 and are transmitted via the antenna ex201 by the receiving/sending circuit unit ex301 after undergoing digital-analog conversion and frequency transformation. Furthermore, during voice call mode with the mobile telephone ex115, after the reception signals received by the antenna ex201 are amplified and undergo frequency transformation, digital-analog conversion, and reverse spread spectrum processing by the modem circuit unit ex306, and are converted to analog voice signals by the voice processing unit ex305, they are output via the voice output unit ex208.

Furthermore, when sending an e-mail in data transmission mode, the text data of the e-mail that is input by operation of the operation keys ex204 of the main unit is sent to the main control unit ex311 via the operation input control unit ex304. The main control unit ex311 transmits the text data to the base station ex110 via the antenna ex201 after spread spectrum processing is executed on it by the modem circuit unit ex306, and then undergoes digital-analog conversion and frequency transformation by the receiving/sending circuit unit ex301.

When sending image data in data transmission mode, the image data captured by the camera unit ex203 is supplied to the image encoding unit ex312 via the camera interface unit ex303. Furthermore, if the image data is not being sent, it is also possible for the image data captured by the camera unit ex203 to be directly displayed on the display unit ex202 via the camera interface unit ex303 and the LCD control unit ex302.

The image encoding unit ex312 is a configuration provided with an image encoding device described in the present application. The image data supplied by the camera unit ex203 is converted to encoded image data by undergoing compression encoding with the encoding method used in the image encoding device shown in the above-described embodiments, and this data is sent to the multiplexing/demultiplexing unit ex308. Furthermore, the mobile telephone device ex115 simultaneously sends voice collected by the voice input unit ex205 during the capturing of images by the camera unit ex203 to the multiplexing/demultiplexing unit ex308 as digital voice data via the voice processing unit ex305.

The multiplexing/demultiplexing unit ex308 performs multiplexing processing of the encoded image data supplied from the image encoding unit ex312 and the voice data supplied from the voice processing unit ex305, and after the multiplexed data obtained as a result of this undergoes spread spectrum processing by the modem circuit unit ex306, and undergoes digital-analog conversion and frequency transformation by the receiving/sending circuit unit ex301, this data is transmitted via the antenna ex201.

When receiving moving image file data linked at a website or the like in data transmission mode, the reception signals received from the base station ex110 via the antenna ex201 undergo reverse spread spectrum processing by the modem circuit unit ex306, and the multiplexed data obtained as a result of this is sent to the multiplexing separation (multiplexing/demultiplexing) unit ex308.

Furthermore, in decoding multiplexed data received via the antenna ex201, the multiplexing separation unit ex308 divides the multiplexed data by demultiplexing it into a bit stream of encoded image data and a bit stream of encoded voice data, and the voice data is supplied to the voice processing unit ex305 along with the encoded image data being supplied to the image decoding unit ex309 via the synchronization bus ex313.

Next, the image decoding unit ex309 is a configuration provided with an image decoding device described in the present application, and moving image data contained in a moving picture file linked from a website, for example, is displayed by decoding the bit stream of encoded image data with a decoding method corresponding to the encoding method shown in the above-described embodiments, generating reproduction moving image data, and supplying this to the display unit ex202 via the LCD control unit ex302. Simultaneous with this, the voice processing unit ex305 converts the voice data to analog voice signals, and then supplies this to the voice output unit ex208, thus allowing the voice data contained in the moving picture file linked from a website, for example, to be reproduced.

Figure 23:
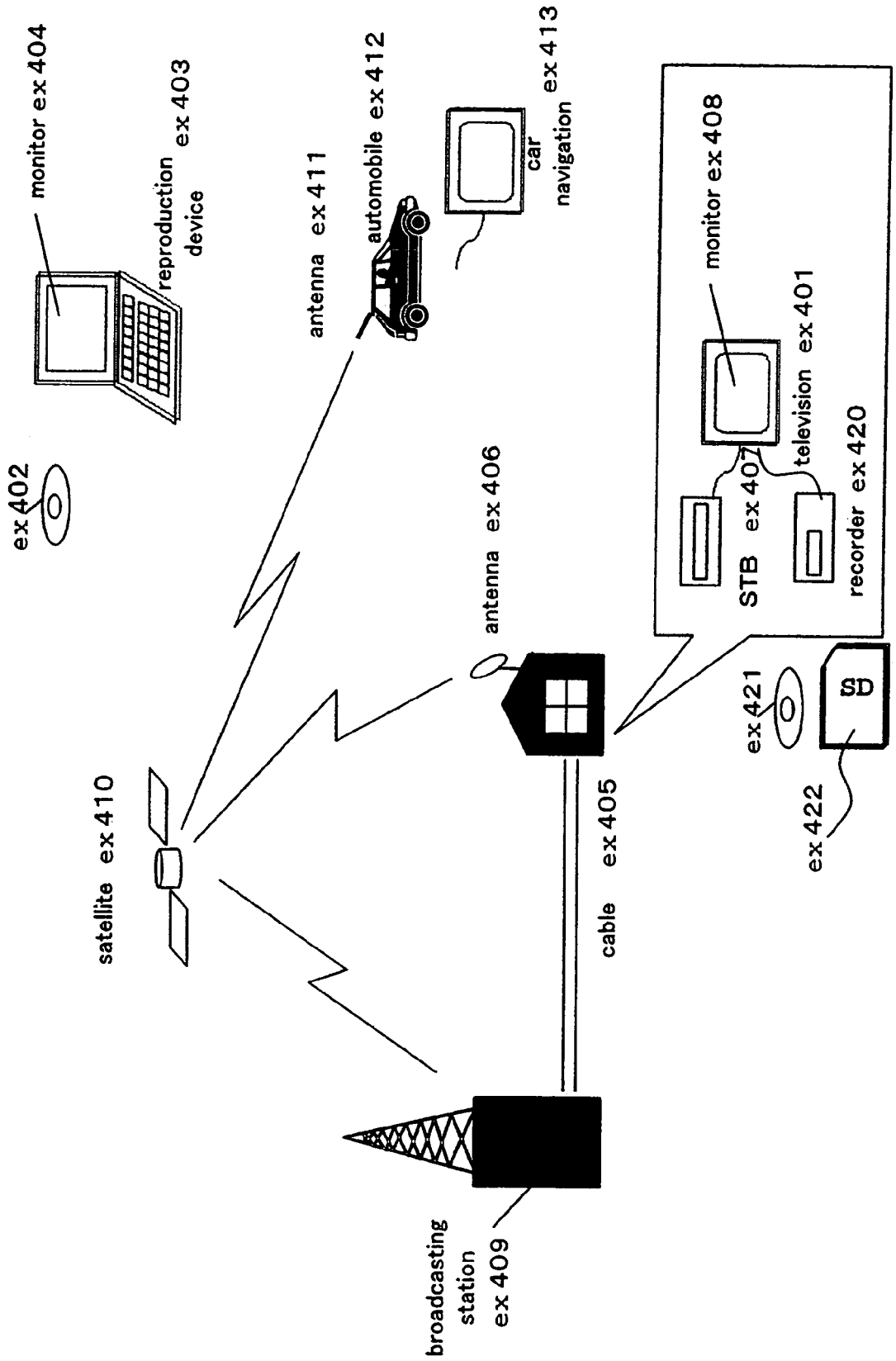
FIG. 23 shows an example of a system for digital broadcasting.

It should be noted that there is no limitation to the examples of the above-described system. In recent years, digital broadcasting via satellite or ground waves has become an issue, and at least one of the image encoding devices or the image decoding devices of the above-described embodiments can be incorporated in systems using digital broadcasting as shown in FIG. 23. Specifically, encoded bit streams of image data are transmitted via radio waves to a communications or broadcasting satellite ex410 with a broadcasting station ex409. The broadcasting satellite ex410 that receives the bit streams issues broadcasting radio waves, and these radio waves are received by an antenna ex406 of a household equipped with satellite broadcast reception facilities. The encoded bit stream is decoded by a device such as a television (receiving device) ex401, a set top box (STB) ex407, or the like, and this decoded bit stream is reproduced. Furthermore, it is possible to install an image decoding device shown in the above-described embodiments in a reproduction device ex403 that reads and decodes encoded bit streams recorded on a storage medium ex402, such as CD and DVD storage media. In this case, the reproduced picture signals are displayed on a monitor ex404. Furthermore, a configuration is also possible in which the image decoding device is installed in a set top box ex407 connected to a cable ex405 for cable television, or a satellite/ground wave broadcasting antenna ex406, and this is reproduced on a television monitor ex408. Here, the image decoding device may be incorporated in the television rather than in the set top box. Furthermore, it is possible for signals from the satellite ex410, from the base station ex107, or the like to be received by an automobile ex412 provided with an antenna ex411, and moving images can be reproduced on a display device in the automobile ex412, such as a car navigation system ex413.

Moreover, it is possible to encode image signals with an image encoding device shown in the above-described embodiments, and record these on a storage medium. Specific examples include DVD recorders that record image signals on a DVD disk ex421, and a recorder ex420 such as a disk recorder that records to a hard disk. In addition, recording may be to an SD card ex422. If the recorder ex420 is provided with an image decoding device shown in the above-described embodiments, image signals recorded on the DVD disk ex421, or the SD card ex422, can be reproduced and displayed on the monitor ex408.

It should be noted that the configuration of the car navigation system ex413 may be such that, for example, the camera unit ex203, the camera interface unit ex303, and the image encoding device ex312 as shown in FIG. 19 are excluded, and this is also similarly possible for the computer ex111 and the television (receiving device) ex401.

Furthermore, the terminal of the above-described mobile telephone ex114 can not only be a send/receive type of terminal having both an encoding device and a decoding device, but can also be a sending terminal with only an encoding device, or a receiving terminal with only a decoding device (three types of installation).

In this way, the moving image encoding method or the moving image decoding method shown in the above-described embodiments may be used in any of the above-described devices or systems, and obtain the described effects of these embodiments by doing so.

5. Other Embodiments

The present invention is not limited to the above-described embodiments, and various other embodiments and modifications are possible without deviating from the scope of the present invention.

The invention claimed is:

1. A variable-length encoding method that encodes unit data composed of a plurality of sub-data while switching variable-length code tables, said method comprising:
   setting a variable-length code table to initial values;
   encoding information that indicates the initialized variable-length code table;
   selecting a variable-length code table to be used in encoding sub-data;
   performing encoding of the sub-data with reference to the selected variable-length code table; and
   placing encoded information indicating the initialized variable-length code table at position before the encoded unit data,
   wherein the variable-length code table is selected based on a value of the encoded sub-data, and the variable-length code table to be used in said encoding of the sub-data is selected based on a value of the immediately prior encoded sub-data.

2. The variable-length encoding method according to claim 1, wherein said encoding of the information is performed with the fixed-length encoding method.

3. The variable-length encoding method according to claim 1, wherein the unit data is picture image data.

4. The variable-length encoding method according to claim 1, wherein the unit data is slice image data.

5. The variable-length encoding method according to claim 1, wherein a plurality of syntax elements for the sub-data include a syntax portion encoded by a variable-length encoding method in which variable-length code tables are switched, and a syntax portion encoded by a fixed-length encoding method.

6. A variable-length encoding method that encodes unit data composed of a plurality of sub-data while switching variable-length code tables, said method comprising:
   setting a variable-length code table to initial values;
   encoding information that indicates the initialized variable-length code tables;
   selecting a variable-length code table to be used in encoding sub-data;
   performing encoding of the sub-data with reference to the selected variable-length code table; and placing encoded information indicating the initialized variable-length code table at a position before the encoded unit data, wherein the variable-length code table is selected based on a value of the encoded sub-data, and the variable-length code table to be used in said encoding of the sub-data is a variable-length code table selected based on a value of the sub-data to be encoded.

7. A readable storage medium that stores a program for executing variable-length encoding on a computer, wherein the variable-length encoding is a variable-length encoding method that encodes unit data while switching variable-length code tables, said method comprising:

setting a variable-length code table to initial values;

encoding information that indicates the initialized variable-length code table;

selecting a variable-length code table to be used in encoding the sub-data;

performing encoding of the sub-data with reference to the selected variable-length code table; and placing encoded information indicating the initialized variable-length code table at a position before the encoded unit data, wherein the variable-length code table is selected based on a value of the encoded sub-data, and the variable-length code table to be used in said encoding of the sub-data is selected based on a value of the immediately prior encoded sub-data.

* * * * *